(12) United States Patent
Yamada et al.

(10) Patent No.: US 7,829,983 B2
(45) Date of Patent: Nov. 9, 2010

(54) SEMICONDUCTOR DEVICE

(75) Inventors: Yutaka Yamada, Osaka (JP); Takeshi Kishida, Osaka (JP); Yoshikazu Tamura, Osaka (JP); Yasuo Sogawa, Osaka (JP); Masanori Hirofuji, Osaka (JP)

(73) Assignee: Panasonic Corporation, Osaka (JP)

( * ) Notice: Subject to any disclaimer, the term of this patent is extended or adjusted under 35 U.S.C. 154(b) by 168 days.

(21) Appl. No.: 11/997,700

(22) PCT Filed: Jul. 28, 2006

(86) PCT No.: PCT/JP2006/315019

§ 371 (c)(1),
(2), (4) Date: Feb. 1, 2008

(87) PCT Pub. No.: WO2007/015435

PCT Pub. Date: Feb. 8, 2007

(65) Prior Publication Data

US 2009/0146273 A1    Jun. 11, 2009

(30) Foreign Application Priority Data

Aug. 1, 2005    (JP) .............................. 2005-222501

(51) Int. Cl.
H01L 23/495    (2006.01)
(52) U.S. Cl. ................. 257/666; 257/678; 257/691; 257/692; 257/724; 257/734; 438/106; 438/111; 438/122; 438/124
(58) Field of Classification Search ..................... None
See application file for complete search history.

(56) References Cited

U.S. PATENT DOCUMENTS 4,947,233 A    8/1990    Aso
5,045,919 A *  9/1991    Nagaoka ..................... 257/786

(Continued)

FOREIGN PATENT DOCUMENTS

JP    63-108733    5/1988

(Continued)

OTHER PUBLICATIONS

International Search Report issued Oct. 24, 2006 in International (PCT) Application No. PCT/JP2006/315019.

(Continued)

*Primary Examiner*—N Drew Richards
*Assistant Examiner*—Kyoung Lee
(74) *Attorney, Agent, or Firm*—Wenderoth, Lind & Ponack, L.L.P.

(57) ABSTRACT

There is provided a semiconductor device adopting, as a layout of pads connected to an external package on an LSI, a zigzag pad layout in which the pads are arranged shifted alternately, which can avoid occurrences of short-circuiting of wires, an increase in chip size due to avoidance of short-circuiting, propagation of power supply or GND noise due to reduction in IO cell interval, and signal transmission delay difference due to displacement of pad positions. In a semiconductor device wherein plural pads on a semiconductor element which are connected to function terminals on an external package are arranged in two lines along the periphery of the semiconductor element, an arrangement order of the plural pads on the semiconductor element is different from an arrangement order of the function terminals on the external package.

6 Claims, 19 Drawing Sheets

U.S. PATENT DOCUMENTS

| | | | |
|---|---|---|---|
| 6,323,548 B1 * | 11/2001 | Hiraga | 257/692 |
| 6,762,490 B2 * | 7/2004 | Suzuki | 257/692 |
| 2001/0011768 A1 | 8/2001 | Kohara et al. | |
| 2003/0227074 A1 * | 12/2003 | Hirano | 257/666 |

FOREIGN PATENT DOCUMENTS

| | | |
|---|---|---|
| JP | 63-187352 | 11/1988 |
| JP | 3-138972 | 6/1991 |
| JP | 3-198358 | 8/1991 |
| JP | 4-269856 | 9/1992 |
| JP | 7-130943 | 5/1995 |
| JP | 9-115945 | 5/1997 |
| JP | 11-87399 | 3/1999 |

OTHER PUBLICATIONS

Written Opinion of the ISA issued Oct. 24, 2006 in International (PCT) Application No. PCT/JP2006/315019.

International Preliminary Report on Patentability issued Nov. 27, 2007 in International (PCT) Application No. PCT/JP2006/315019.

* cited by examiner

SEMICONDUCTOR DEVICE

BACKGROUND OF THE INVENTION

I. Technical Field

The present invention relates to a semiconductor device, and more particularly, to a semiconductor design technique, a structure of a semiconductor device, and a semiconductor element.

II. Description of the Related Art

In manufacturing a semiconductor device, there is a wire-bonding technique for connecting pads disposed on a LSI with a lead frame attached to a package by using fine conductive wires. This technique has conventionally been progressed in technological establishment, and now it is widely used because it realizes relatively easy connection and high reliability. In recent years, high-density integration of semiconductor elements has been increasingly progressed, and the number of pins has increased with an increase in functions of the semiconductor elements. Therefore, for example, it is necessary to connect several tens to several hundreds of pads disposed along the periphery of an element with lead terminals by conductive wires one by one, and further, it is necessary to prevent electrical short-circuiting due to contacts of the conductive wires, and false operation due to the contacts.

Conventionally, Japanese Published Patent Application No. Hei.4-269856 has been disclosed as a technique to solve these problems.

In this prior art, as shown in FIG. 23, a semiconductor element 13-1 is constituted such that many pads are arranged along its periphery by arranging inner pads 13-2 and outer pads 13-3 in two lines in a zigzag manner along the periphery. When this semiconductor element 13-1 is applied to a semiconductor device, the inner pads 13-2 and the outer pads 13-3 are connected to leads by conductive wires 13-4 and 13-5 such as gold wires alternately in order of inner pad, outer pad, inner pad, outer pad, . . . . At this time, the pads to which the conductive wires 13-4 are connected are disposed on the inner side than the pads to which the conductive lines 13-5 are connected.

In the conventional semiconductor device, electrical contacts between the conductive wires 13-4 for connecting the leads to the inner pads and the conductive wires 13-5 for connecting the leads to the outer pads are avoided as described above.

SUMMARY OF THE INVENTION

Problems to be Solved by the Invention

However, it is difficult to avoid contacts of the connection wires between the pads and the semiconductor element in the semiconductor device using the zigzag pad layout, and thereby electrical short-circuiting due to contacts of the connection wires and false operation due to the contacts occur, resulting in deteriorated operation quality. Further, if the interval between the pads or the leads is increased to avoid the electrical short-circuiting due to contacts of the connection conductors, it invites an increase in chip size.

The present invention is made to solve the above-described problems and has for its object to provide a semiconductor device which can avoid contacts of connection wires pads on a semiconductor element and function terminals in a lead frame in a semiconductor device using the zigzag pad layout, and which can achieve quality improvement as well as reduction in chip size.

According to Claim 1 of the present invention, there is provided a semiconductor device (1) having a semiconductor element in which plural pads on the semiconductor element that are connected to plural function terminals in a lead frame of an external package via conductive wires are arranged in two lines along the periphery of the semiconductor element, wherein the pads in the respective lines of the plural pads which are arranged in two lines along the periphery of the semiconductor element are arranged closely to each other, semiconductor element has positions where an arrangement order of the plural pads in one direction along the periphery, differs from an arrangement order of the plural function terminals in the lead frame of the external package, and the conductive wires are connected so as not to intersect with each other when the semiconductor element is viewed from above.

According to a semiconductor device (1-1) relating to a second aspect of the present invention, two conductive wires are connected to one function terminal in the lead frame and the two conductive wires are respectively connected to two pads on the semiconductor element, at the positions where the arrangement order of the plural function terminals in the lead frame on the external package side differs from the arrangement order of the plural pads arranged in two lines along the periphery of the semiconductor element, in one direction along the periphery.

According to a semiconductor device (1-2) relating to a third aspect of the present invention, the one function terminal in the lead frame, to which the two conductive wires are connected, is a function terminal which supplies power supply voltage or GND.

According to a semiconductor device (1-3) relating to a fourth aspect of the present invention, both of the two pads on the semiconductor element which are connected to the one function terminal on the lead frame via the two conductive wires are power supply pads or GND pads, and an IO circuit unit which operates for signal input or output is disposed sandwiched between the two power supply pads or GND pads on the semiconductor element.

In summary, the semiconductor device (1) according to the first aspect of the present invention is a semiconductor device in which pads connected to an external package are arranged in two lines along the periphery of a semiconductor element, and an arrangement order of a pad layout on the semiconductor element differs from an arrangement order of function terminals in the external package.

Further, according to the semiconductor device (1-1) relating to a second aspect of the present invention, two conductive wires from one lead terminal on the external package side are respectively connected to two pads in the pad layout, at positions where the arrangement order of the pad layout differs from the arrangement order of the function terminals in the external package.

Further, according to the semiconductor device (1-2) relating to a third aspect of the present invention, in the semiconductor device (1-1), the separated two pads are respectively connected to power supply or GND function circuits as IO circuit units.

Further, according to the semiconductor device (1-3) relating to a fourth aspect of the present invention, the semiconductor device (1-2) includes an IO circuit unit which is disposed in a position sandwiched between the separated two power supply or GND terminals, and operates as a signal input or output circuit.

According to the semiconductor device (1) of the present invention, since the arrangement order of the pads on the semiconductor element and the arrangement order of the leads in the package on the semiconductor device are partially mismatched from each other, it is possible to avoid that the conductive wires contact when connecting the leads to the pads and thereby false operation occurs. Further, since it is not necessary to increase the pad interval to avoid such contact, an increase in the chip size of the semiconductor element can be avoided, and thereby a reduction in the chip size can be achieved.

Further, according to the semiconductor device (1-1), the same signal can be propagated from one terminal to two IO circuit units, and the same signal can be directly inputted/outputted from the outside to different places, thereby suppressing a reduction in the wiring resource in the semiconductor element.

Further, according to the semiconductor device (1-2), a power supply or a GND is connected to each of nonadjacent IO circuit units, whereby the power supply points to the inside of the semiconductor element can be dispersed, resulting in stabilized power supply.

Further, according to the semiconductor device (1-3), an IO circuit unit in which input/output operation frequently occurs is disposed between IO circuit units for power supply or GND supply, and power supply voltage or GND is supplied from the both sides of the IO circuit. Thereby, power supply or GND noise due to the operation of the IO control circuit in which input/output operation frequently occurs can be reduced, and influences to the environment can be reduced.

Further, according to the semiconductor device (2) and the semiconductor device (2-1), signals of the same potential can be inputted to or outputted from nonadjacent IO circuit units by using one conductive wire, and power supply noise due to the operation of the sandwiched IO circuit unit can be suppressed by supplying power supply voltage or GND as the input signals, and further, a reduction in yield during assembly can be avoided because two conductive sires are not required, whereby the IO circuit units can be reduced.

Further, according to the semiconductor device (3), the inner pads are movable toward the inside of the chip, whereby the pad positions can be adjusted so that contact of conductive wires can be easily avoided.

Further, according to the semiconductor device (4), when utilizing correlation of signals between terminal pads, the pads are integrated to either of inner pads or outer pads, whereby variations in conductive wire lengths can be reduced, and occurrence of signal delay can be suppressed.

Further, according to the semiconductor device (5-1), one IO circuit unit has two pads, and conductive wires are connected to the respective pads from one lead terminal, whereby an allowable current amount twice as large as that of the conductive wire can be supplied.

Further, according to the semiconductor device (5-2), the above-described two pads are not directly connected by the IO circuit unit, whereby common impedance from the lead terminal can be reduced.

Further, according to the semiconductor device (5-3), one IO circuit unit has two pads, and the same signal is supplied to the respective pads from two lead terminals on the external package which have the same function. Therefore, the allowable current can be increased, and further, the IO circuit units can be reduced because the structure can be realized with one IO circuit unit.

Further, according to the semiconductor device (5-4), one IO circuit unit has two pads, and different two signals are connected to the respective pads from two lead terminals on the external package which have different functions. Therefore, two kinds of signals can be processed by one IO circuit unit, whereby the IO circuit units can be reduced, resulting in a reduction in chip size.

DETAILED DESCRIPTION OF THE INVENTION

Embodiment 1

Hereinafter, a semiconductor device 300 (semiconductor device 1) according to a first embodiment of the present invention will be described with reference to the drawings.

Figure 3:
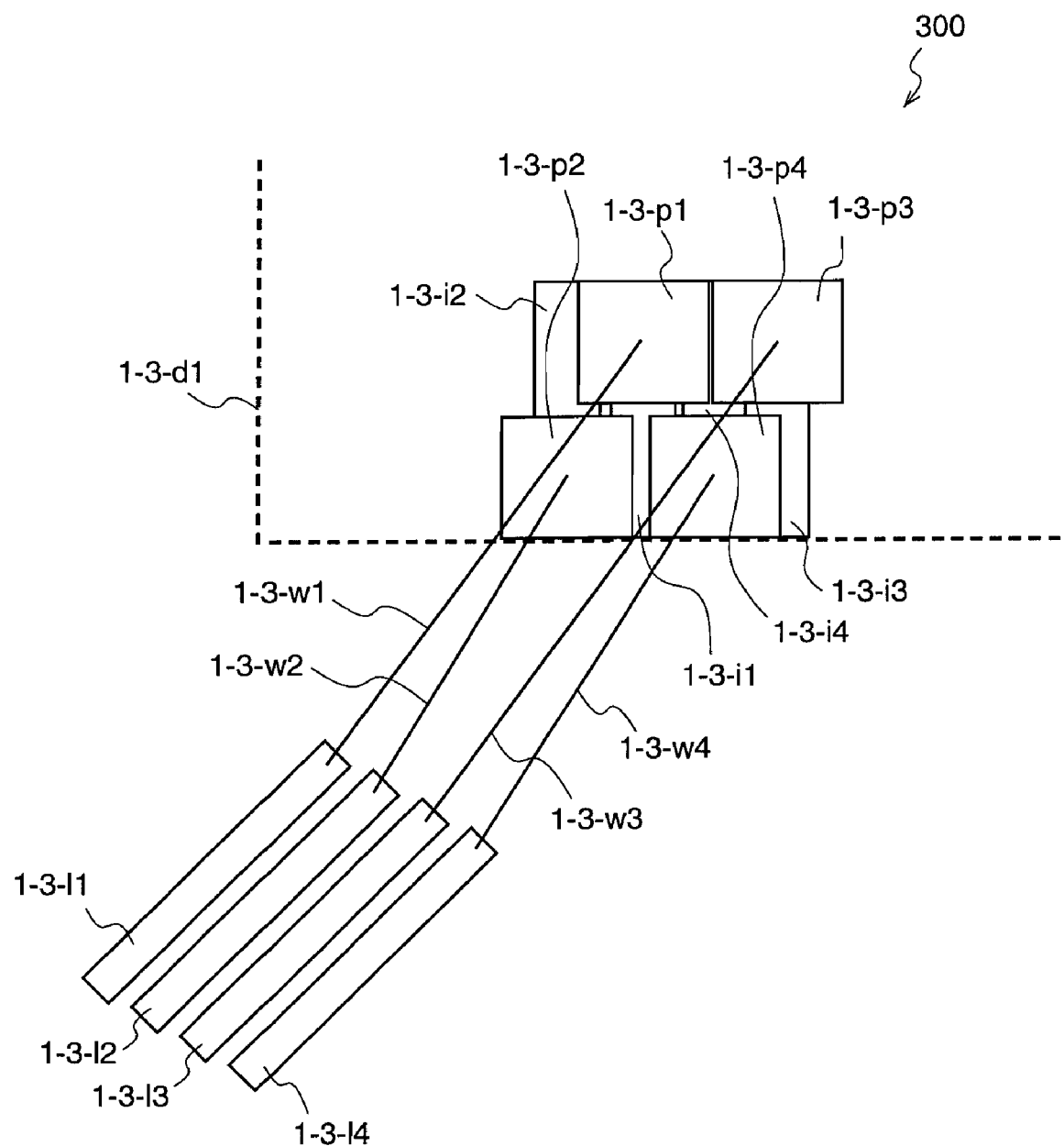
FIG. 3 is a partially expanded plan view of a semiconductor device 300 according to a first embodiment of the present invention corresponding to Claim 1.

FIG. 3 is a partially expanded plan view illustrating a semiconductor device 300 according to a first embodiment of the present invention.

Figure 1:
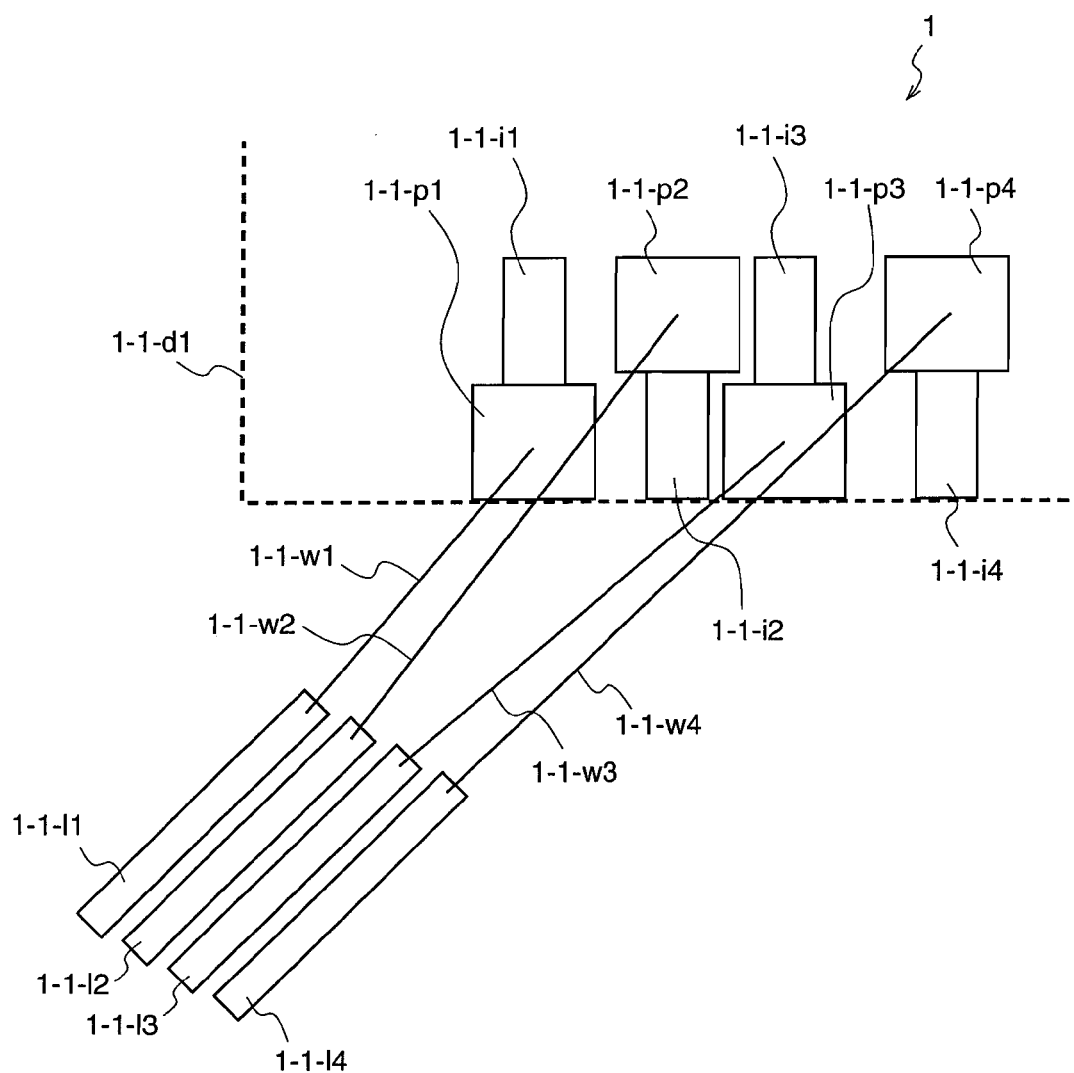
FIG. 1 is a partially expanded plan view of a conventional semiconductor device.

FIG. 1 is a partially expanded plan view of a conventional semiconductor device 1. In the conventional semiconductor device 1 shown in FIG. 1, a lead terminal 1-1-*l*1 is connected to a pad 1-1-*p*1 via a conductive wire 1-1-*w*1 and further it is connected to the inside of the semiconductor element through an IO circuit unit 1-1-*i*1. Likewise, a lead terminal 1-1-*l*2 is connected to a pad 1-1-*p*2 via a conductive wire 1-1-*w*2 and further it is connected to the inside of the semiconductor element through an IO circuit unit 1-1-*i*2. A lead terminal 1-1-*l*3 and subsequent lead terminals are similarly connected as shown in FIG. 1.

Figure 2:
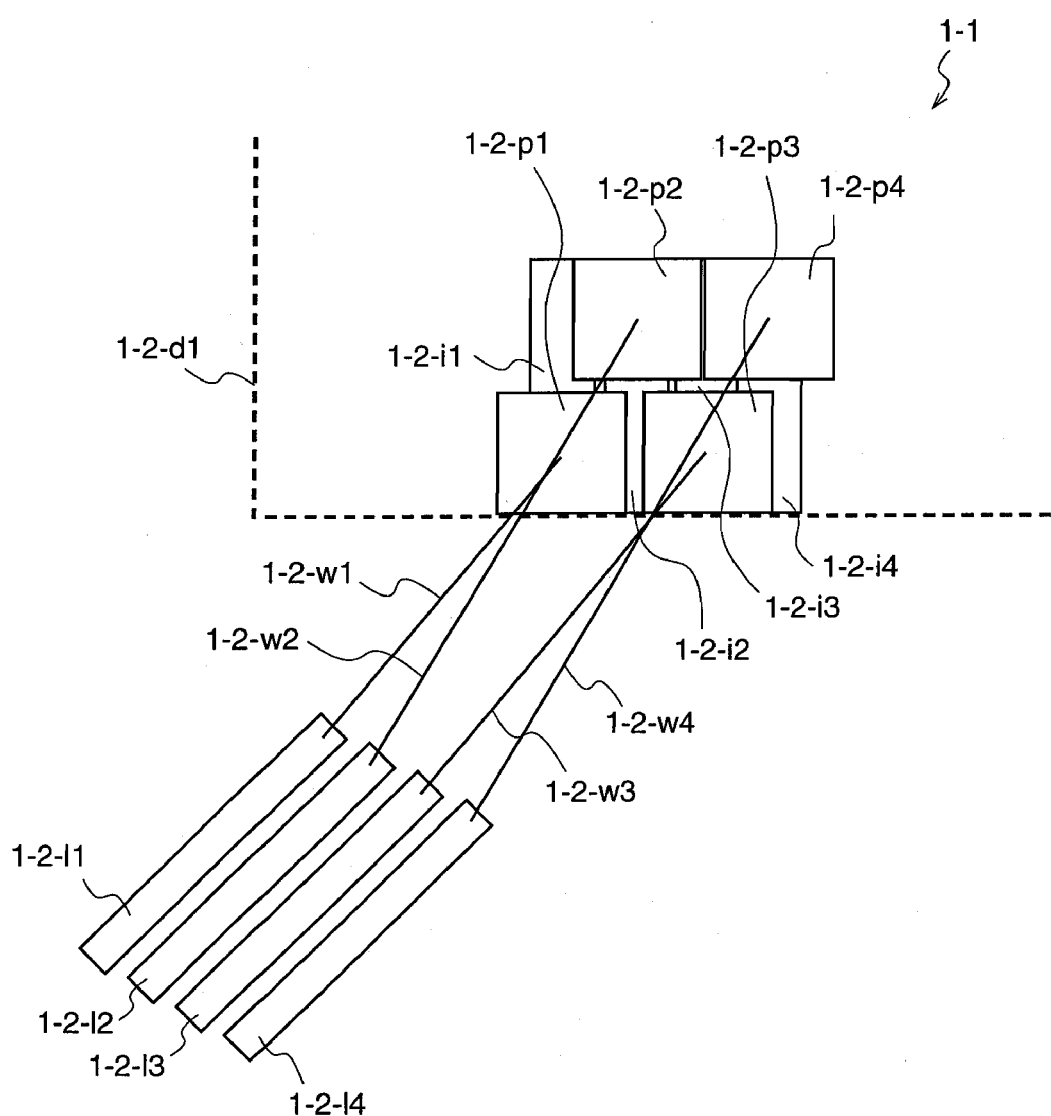
FIG. 2 is a diagram illustrating a conventional semiconductor device 1-1 in which pads and IO circuit units connected to the pads are arranged as close as possible in a case where the size of the semiconductor element shown in FIG. 1 is reduced and the length of each side is shortened.

FIG. 2 is a diagram illustrating a semiconductor device 1-1 in which the pads and the IO circuit units connected thereto are disposed as closely as possible, in the case where the size of the semiconductor element is reduced and the length of each side is shortened relative to those shown in FIG. 1.

In FIG. 2, since the pad disposition interval is reduced and thereby the connection angle from the lead terminal to the pad changes, undesirable contacts occur between a conductive wire 1-2-*w*1 and a conductive wire 1-2-*w*2 and between a conductive wire 1-2-*w*3 and a conductive wire 1-2-*w*4. In this state, signals cannot be correctly transferred due to the contacts of the conductive wires, resulting in trouble in the circuit operation.

So, the first embodiment of the present invention provides the semiconductor device 300 shown in FIG. 3.

The semiconductor device 300 of the first embodiment shown in FIG. 3 is characterized as follows. When performing usual pad connection, as a construction for avoiding contacts of conductive wires which occur as described above, the pad 1-2-*p*1 and the pad 1-2-*p*2 on the semiconductor element are replaced with each other with respect to the conductive wire 1-2-*w*1 and the conductive wire 1-2-*w*2 between which wire contact occurs as shown in FIG. 2, and according to this replacement, the IO circuit unit 1-2-*i*1 and the IO circuit unit 1-2-*i*2 connected to these pads are replaced with each other. Likewise, the pad 1-2-*p*3 and the pad 1-2-*p*4 are replaced with each other with respect to the conductive wire 1-2-*w*3 and the conductive wire 1-2-*w*, and according to this replacement, the IO circuit unit 1-2-*i*3 and the IO circuit unit 1-2-*i*4 are replaced with each other. Thereby, as shown in FIG. 3, contacts of conductive wires are avoided, and a structure which can be assembled without troubles trouble is provided.

As described above, according to the semiconductor device 300 (semiconductor device 1) of the first embodiment, when performing normal pad connection in the semiconductor device wherein the pads to be connected to the external package are arranged in two lines along the periphery of the semiconductor element, as a construction for avoiding contacts of the conductive wires which occur as described above, two pads on the semiconductor element are replaced with each other with respect to two conductive wires between which contact might occur, and according to this replacement, two IO circuit units to be connected to these pads are replaced with each other, and further, such replacement is similarly repeated. Therefore, undesirable contacts between the conductive wires which connect the leads on the external package with the pads on the semiconductor element are avoided, and thereby assembly can be performed without trouble, and moreover, a reduction in the area of the semiconductor element more than that by the conventional method can be achieved.

Embodiment 2

Next, a semiconductor device 400 (semiconductor device 1-1) according to a second embodiment of the present invention will be described.

Figure 4:
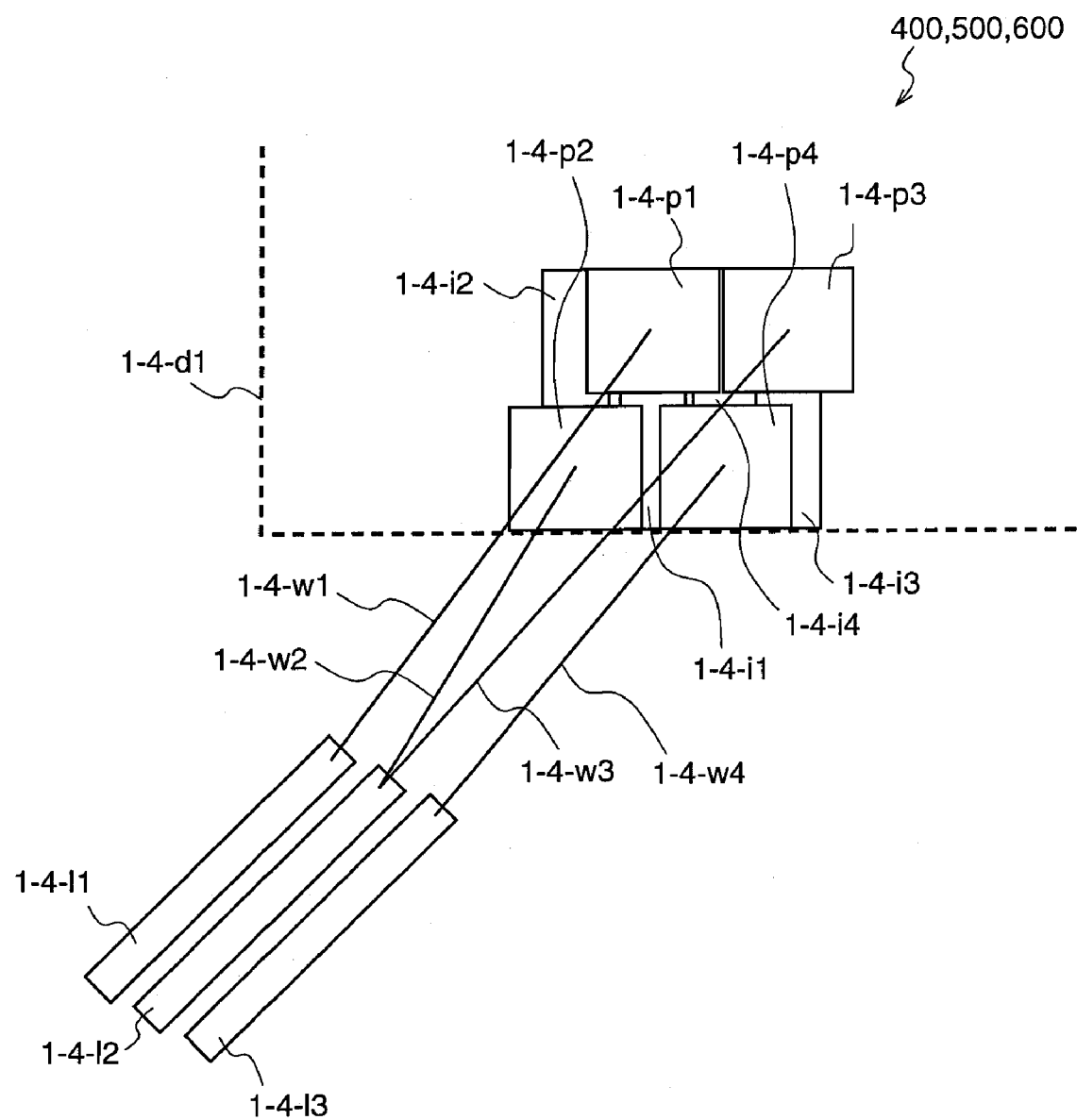
FIG. 4 is a partially expanded plan view of a semiconductor device 400, 500, or 600 according to a second, third, or fourth embodiment of the present invention which correspond to Claim 2, 3, or 4, respectively.

FIG. 4 is a plan view illustrating the semiconductor device 400 according to the second embodiment.

The semiconductor device 400 according to the second embodiment is constituted such that two conductive wires are connected to two pads from a lead terminal 1-3-*l*2 in the semiconductor device 300 according to the first embodiment shown in FIG. 3.

There has conventionally been a technique of connecting two conductive wires from one lead terminal to two pads. In the conventional technique, however, the pads and IO circuit units to which the two conductive wires are connected must be adjacently arranged so that no contact occurs between the conductive wires.

In the semiconductor device 400 of the second embodiment shown in FIG. 4, as a method for avoiding conductive wire contact, the arrangement orders of the pads and the IO circuit units are changed.

To be specific, as shown in FIG. 4, a lead terminal 1-4-*l*2 is a lead terminal from which the two conductive wires 1-4-*w*2 and 1-4-*w*3 are drawn, and the respective conductive wires 1-4-*w*2 and 1-4-*w*3 are connected to the pads 1-4-*p*2 and 1-4-*p*3, and further, plural IO circuit units are arranged such that, among the IO circuit units, the IO circuit units 1-4-*i*2 and 1-4-*i*3 to be respectively connected to the pads 1-4-*p*2 and 1-4-*p*3 are not disposed adjacent to each other but some IO circuit units 1-4-*i*1 and 1-4-*i*4 having different functions are disposed between the IO circuit units 1-4-*i*2 and 1-4-*i*3. That is, the respective IO circuit units are arranged in order of 1-4-*i*2, 1-4-*i*1, 1-4-*i*4, 1-4-*i*3 from left hand in the figure, whereby the respective IO circuit units can be arranged so that no conductive wire contact occurs between the circuit units.

As described above, the semiconductor device 400 (semiconductor device 1-1) according to the second embodiment has the construction similar to that of the first embodiment, and further, it is constructed such that one lead terminal is connected to separated two IO circuit units **1-4-*i*2 and 1-4-*i*3** on the semiconductor element by the respective lead lines. Thereby, it becomes possible to connect one lead terminal to separated two IO circuit units on the semiconductor element using the respective lead lines, thereby providing a semiconductor device which can receive or transmit the same signal at two positions on the semiconductor element without extending the wiring in the semiconductor element.

Embodiment 3

Next, a semiconductor device 500 (semiconductor device 1-2) according to a third embodiment of the present invention will be described.

A plan view of the semiconductor device 500 according to the third embodiment is shown in FIG. 4 like the semiconductor device 400 according to the second embodiment, wherein a power supply or GND function is assigned as a terminal function of a lead terminal **1-4-*l*2, and the lead terminal 1-4-*l*2 is connected to pads 1-4-*p*2 and 1-4-*p*3 via conductive wires 1-4-*w*2 and 1-4-*w*3, respectively, and IO circuit units 1-4-*i*2 and 1-4-*i*3 as IO circuits for power supply or GND are arranged as IO circuit units to be connected to the pads 1-4-*p*2 and 1-4-*p*3**, respectively.

Thereby, it is possible to supply power supply voltage or GND from the separated two IO circuit units **1-4-*i*2 and 1-4-*i*3**.

As described above, the semiconductor device 500 (semiconductor device 1-2) according to the third embodiment is constructed such that, in the construction of the second embodiment, the terminal to which two wires are connected is given a terminal function for supplying power supply voltage or GND. Therefore, the power supply points are increased, whereby the power supply in the semiconductor element can be stabilized.

Embodiment 4

Next, a semiconductor device 600 according to a fourth embodiment will be described.

A plan view of the semiconductor device 600 of the fourth embodiment is shown in FIG. 4 like the semiconductor devices 300 and 400 according to the second and third embodiments.

In FIG. 4, as in the third embodiment, a power supply or GND function is assigned as a terminal function to a lead terminal **1-4-*l*2, and the lead terminal 1-4-*l*2 is connected to pads 1-4-*p*2 and 1-4-*p*3 via conductive wires 1-4-*w*2 and 1-4-*w*3, respectively, and further, IO circuit units 1-4-*i*2 and 1-4-*i*3 as IO circuits for power supply or GND are arranged as IO circuit units to be connected to the pads 1-4-*p*2 and 1-4-*p*3, and IO circuit units operating as function terminals are disposed inside or outside the semiconductor element as IO circuit units 1-4-*i*1 and an IO circuit unit 1-4-*i*4 to be sandwiched by the IO circuit unit 1-4-*i*2 and the IO circuit unit 1-4-*i*3** which are disposed as the power supply or GND IO circuits. In this way, power supply voltage or GND is supplied from the IO circuit unit surrounded by the power supply or GND to the IO circuit unit constituting the function terminal.

Since the semiconductor device 600 (semiconductor device 1-3) according to the fourth embodiment is constituted as described above, it is possible to reduce noise that is caused by operation of the function terminal surrounded by the IO circuit units for power supply or GND.

Embodiment 5

Figure 5:
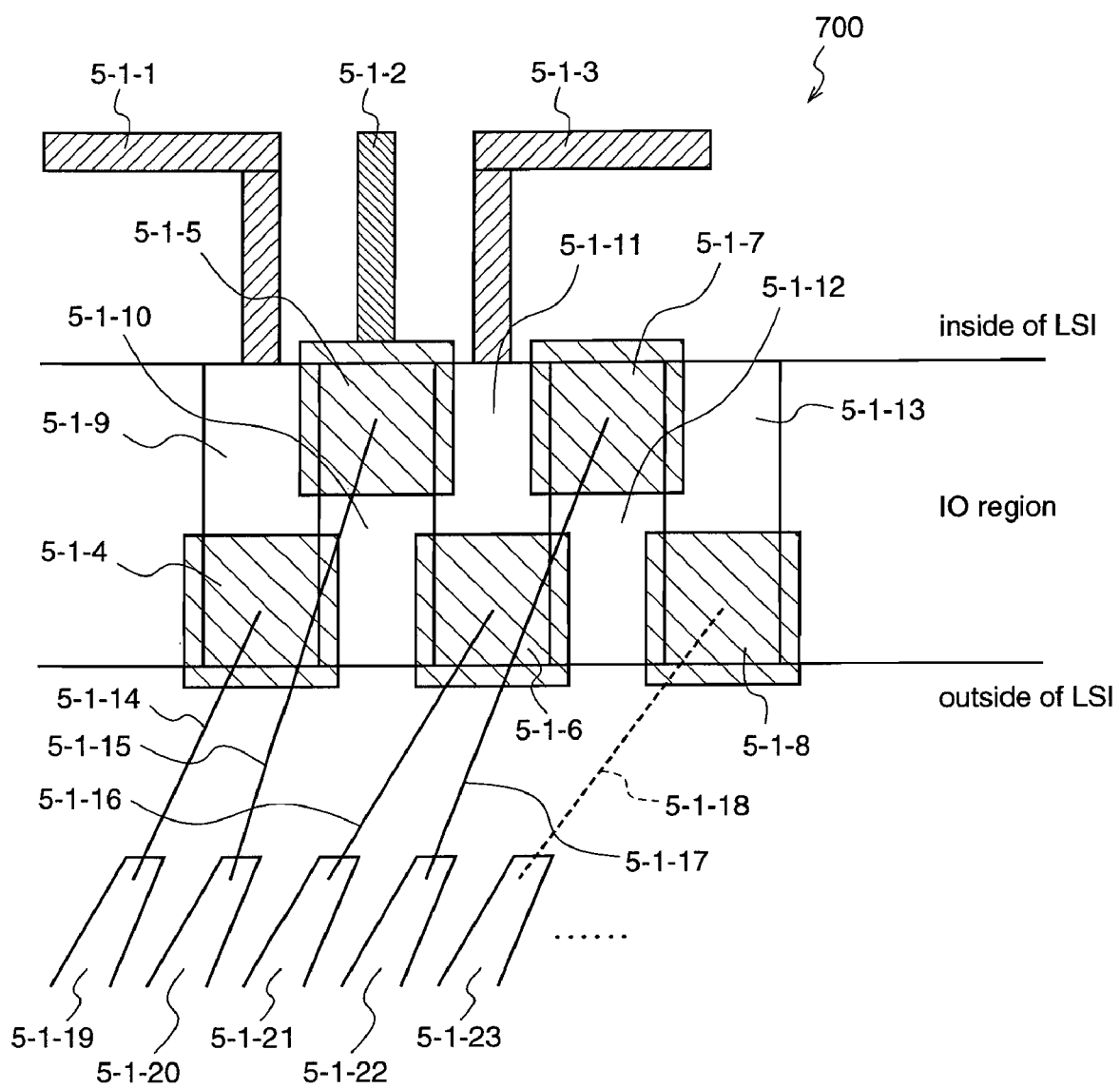
FIG. 5 is a diagram illustrating a pad connection before it is changed in a semiconductor device 700 according to a fifth embodiment of the present invention.

FIG. 5 is a diagram illustrating a semiconductor device 700 (semiconductor device 2) according to a fifth embodiment of the present invention, which has a pad layout before the pad connection in the semiconductor device 300, 400, 500, or 600 of the first, second, third, or fourth embodiment is changed.

In FIG. 5, when a signal wiring 5-1-1 should be arranged on the right side of a signal wiring 5-1-2 without intersecting with the signal wiring 5-1-2, a signal of the same potential as that of an IO circuit unit 5-1-9 is input to an IO circuit unit 5-1-11, and the signal wiring 5-1-1 must be arranged in the LSI as a signal wiring 5-1-3. In this case, there are 1) a method of connecting a lead terminal 5-1-19 to a pad 5-1-4 and a pad 5-1-6 with two conductive wires, and 2) a method of connecting the same signal as that of the lead terminal 5-1-19 from a lead terminal 5-1-21 to the pad 5-1-6 with a conductive wire.

In the case 1), when the lead terminal 5-1-19 is connected to the pad 5-1-6 with a conductive wire, this conductive wire intersects with the conductive wire 5-1-15, and thereby yield in assembly is reduced. In the case 2), a new terminal must be provided, leading to an increase in IO terminals.

Figure 6A:
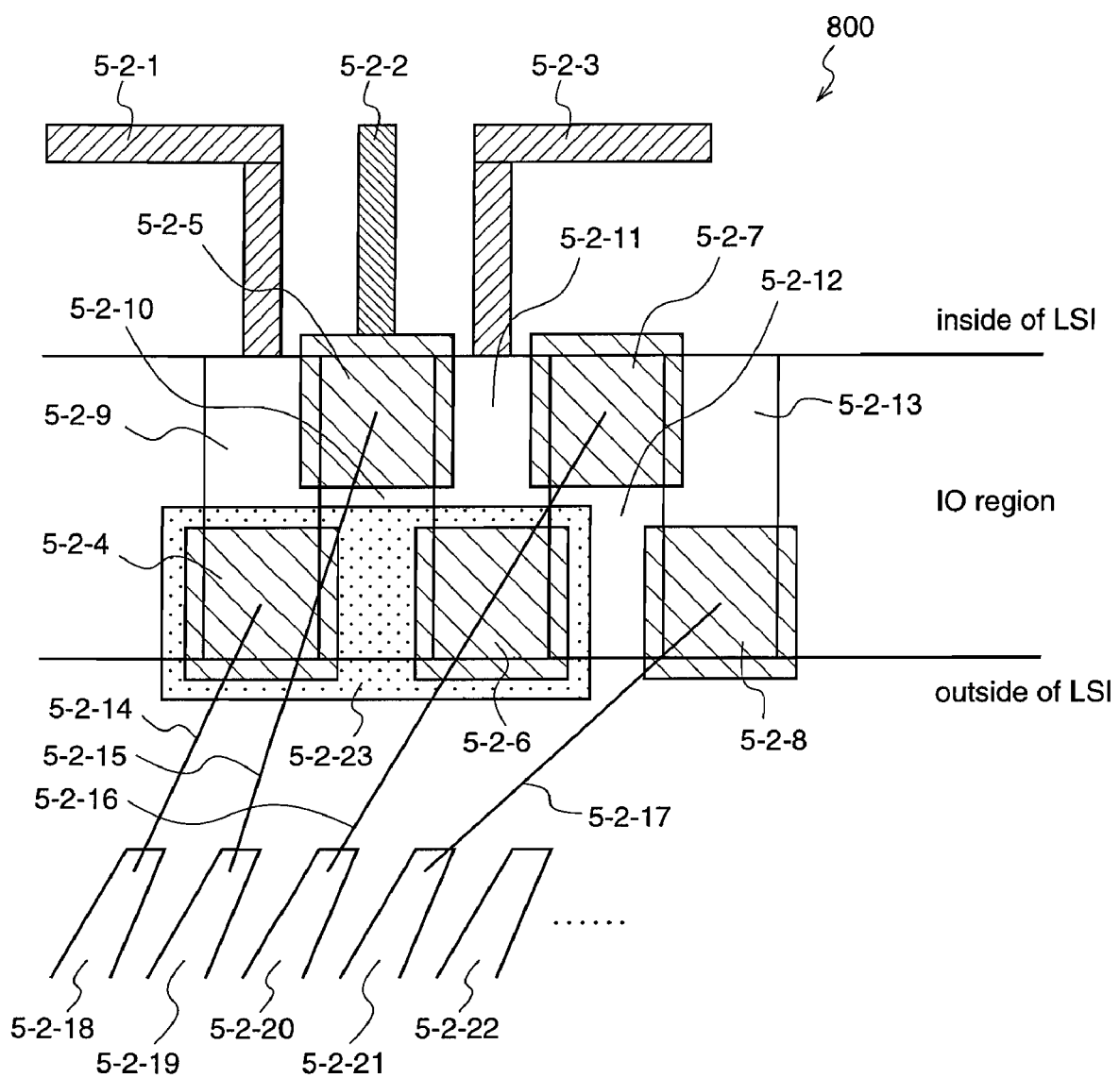
FIG. 6(a) is a plan view illustrating a pad layout after pad connection is changed in the semiconductor device 700 according to the fifth embodiment of the present invention, and a pad layout in a semiconductor device 800 according to a sixth embodiment of the present invention.
Figure 6B:
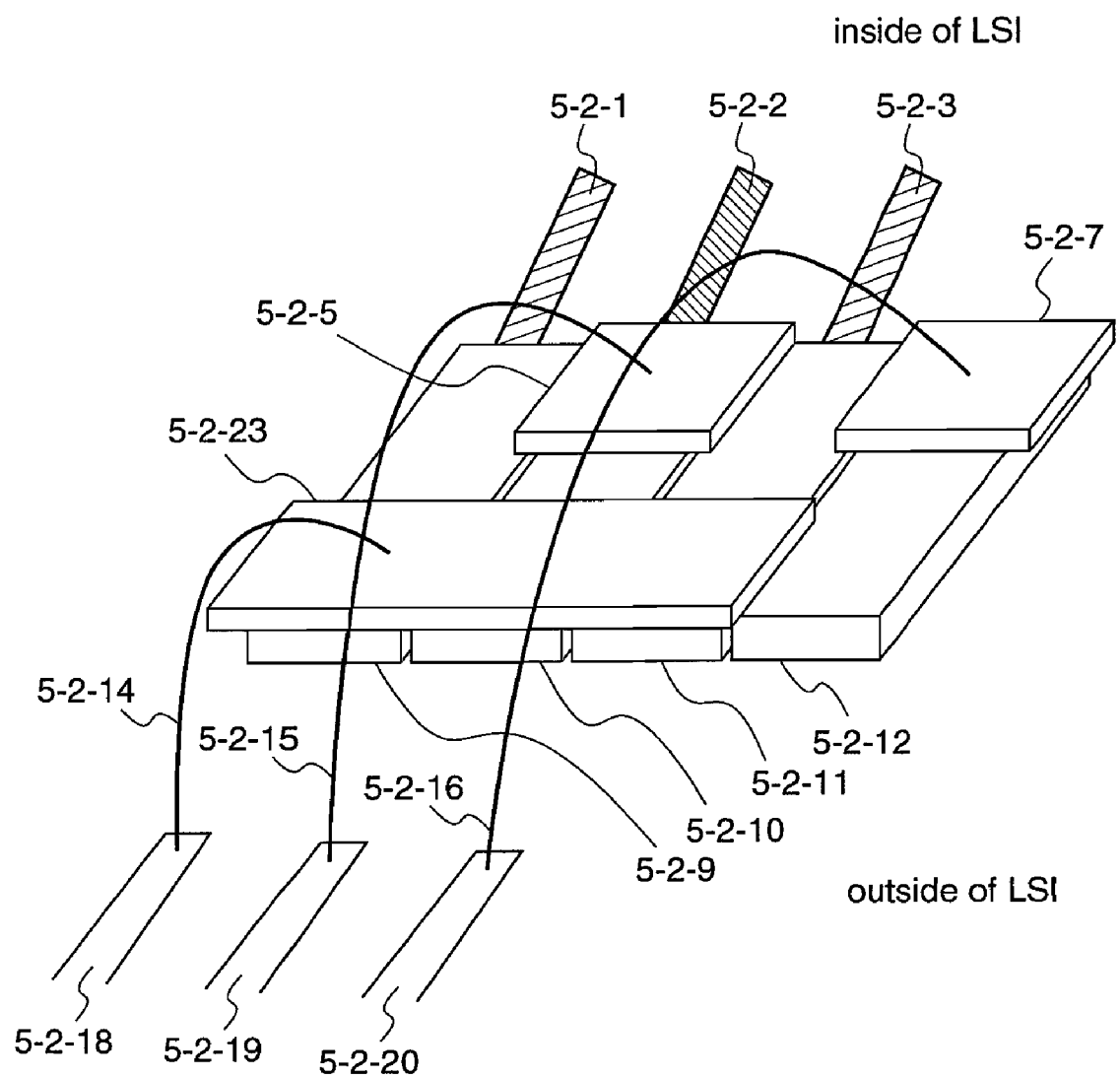
FIG. 6(b) is a perspective view illustrating a pad layout after pad connection is changed in the semiconductor device 700 according to the fifth embodiment of the present invention, and a pad layout in a semiconductor device 800 according to a sixth embodiment of the present invention.

FIGS. 6(*a*) and 6(*b*) are a plan view and a perspective view of a pad layout which is obtained after the pad connection in the semiconductor device 700 of the fifth embodiment is changed to resolve the above-mentioned problem.

Adjacent pads 5-2-4 and 5-2-6 of nonadjacent IO circuit units 5-2-9 and 5-2-11 are bonded using a material 5-2-23 which forms the pads, whereby the IO circuit unit 5-2-9 and the IO circuit unit 5-2-11 can be set at the same potential by using only one conductive wire 5-2-14, and the wire 5-1-3 of the same potential as the wire 5-1-5 can be taken out in a different direction without intersecting with the wire 5-1-2 of the IO circuit unit 5-2-10.

Further, the above-described bonding of the adjacent pads with the material that forms the pads may be performed not only for the pads outside the LSI but also for the adjacent pads in the LSI, with the same effects as mentioned above.

As described above, the semiconductor device 700 (semiconductor device 2) according to the fifth embodiment is constituted such that the adjacent pads 5-2-4 and 5-2-6 of the nonadjacent IO circuit units 5-2-9 and 5-2-11 are bonded together with the material 5-2-23 which forms the pads. Thereby, the IO circuit unit 5-2-9 and the IO circuit unit 5-2-11 can be set at the same potential by using the one conductive wire 5-2-14, and the wire 5-1-3 of the same potential as the wire 5-1-1 can be taken out in the different direction without intersecting with the wire 5-1-2 of the IO circuit unit 5-2-10. Therefore, a desired circuit can be constituted without reducing the yield during assembly, and without increasing the IO terminals.

Embodiment 6

Next, a semiconductor device 800 (semiconductor device 2-1) according to a sixth embodiment of the present invention will be described.

The semiconductor device 800 according to the sixth embodiment is constituted such that, in the pad layout obtained after the pad connection is changed in the semiconductor device 700 according to the fifth embodiment, either of the IO circuit unit 5-2-9 or the IO circuit unit 5-2-11 is used as either of a power supply terminal or a GND terminal, while the other IO circuit unit is used as the other terminal.

Thereby, influence of noise to the signal wiring 5-1-2 can be reduced.

As described above, the semiconductor device 800 (semiconductor device 2-1) according to the sixth embodiment is constituted such that, in the semiconductor device 700 shown in FIG. 6, either of the IO circuit unit 5-2-9 or the IO circuit unit 5-2-11 is used as either of a power supply terminal or a GND terminal, while the other IO circuit unit is used as the other terminal, thereby providing a semiconductor device which can reduce influence of noise to the signal wiring 5-1-2.

Embodiment 7

Figure 7:
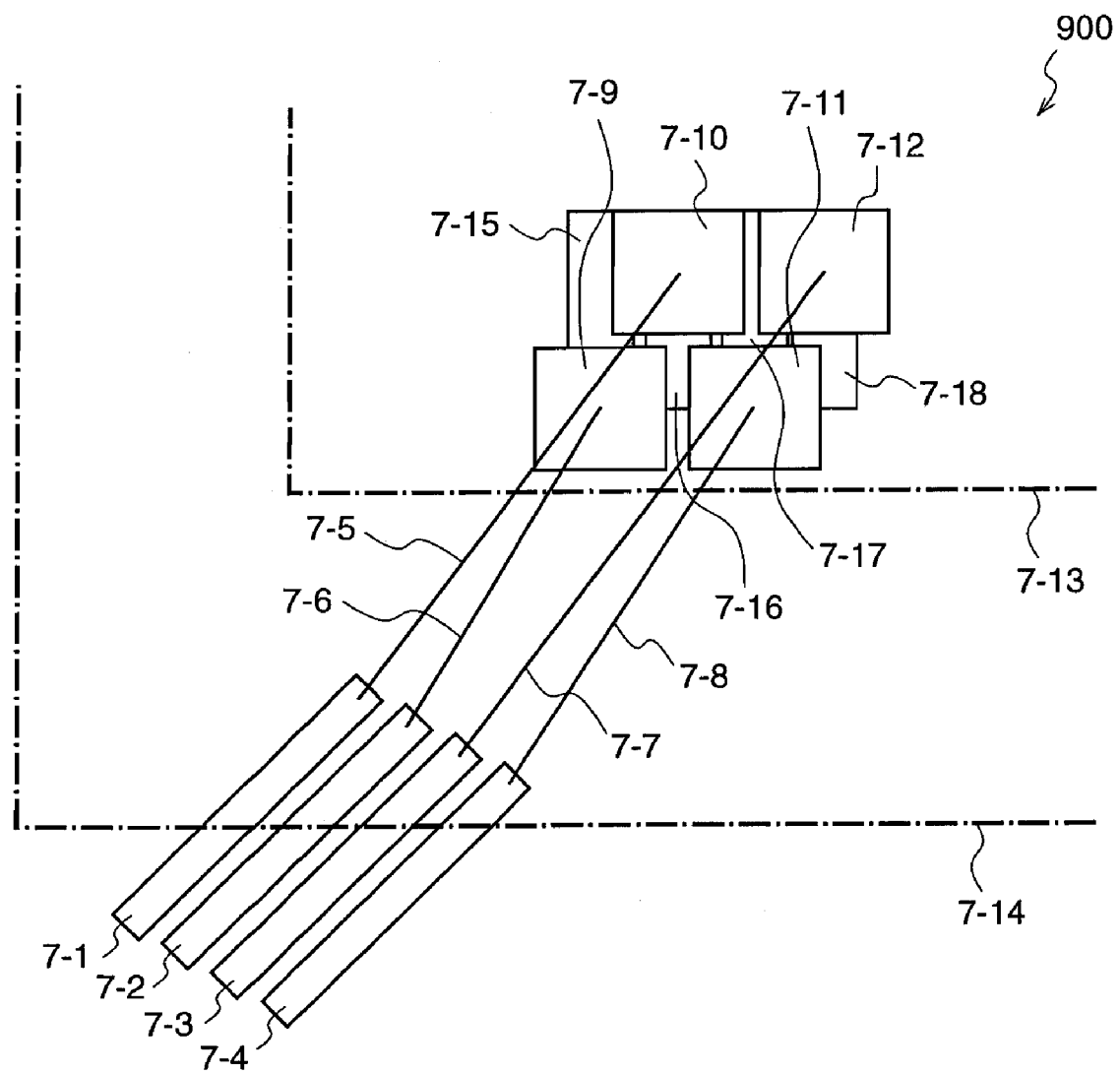
FIG. 7 is a diagram illustrating a layout configuration of IO circuit units before layout change in a semiconductor device 900 according to the seventh embodiment of the present invention.

FIG. 7 is a diagram illustrating a layout configuration of IO circuit units before layout change in a semiconductor device 900 (semiconductor device 3) according to a seventh embodiment of the present invention.

While the semiconductor device 900 (semiconductor device 3) according to the seventh embodiment is intended to avoid contacts of conductive wires between lead terminals and pads at four corners of a semiconductor chip, FIG. 7 shows only the layout configuration of the IO circuit units at one corner.

In FIG. 7, 7-1 to 7-4 denote lead terminals, 7-5 to 7-8 denotes conductive wires, 7-9 to 7-12 denote pads, 7-13 denotes a semiconductor chip, 7-14 denotes a lead frame, 7-15 to 7-18 denote IO circuit units.

The lead terminals 7-1 to 7-4 are disposed on the lead frame 7-14 and connected to package pins. Further, the lead terminals 7-1 to 7-4 are connected to the pads 7-9 to 7-12 on the semiconductor chip 7-13 using the conductive wires 7-5 to 7-8, respectively. Further, the pads 7-9 to 7-12 are disposed on the IO circuit units 7-15 to 7-18, and connected to the IO circuit units 7-15 to 7-18, respectively.

In the layout configuration of the IO circuit units 7-15 to 7-18 before layout change in the semiconductor device 900 according to the seventh embodiment shown in FIG. 7, a zigzag layout configuration is adopted in which the adjacent pads 7-9 to 7-12 are alternately arranged at an inner side and an outer side in the semiconductor chip, and a difference between an angle at which the conductive wire 7-6 that connects the outer pad 7-9 and the lead terminal 7-2 to be connected thereto is arranged and an angle at which the conductive wire 7-5 that connects the inner pad 7-10 and the lead terminal 7-1 to be connected thereto is arranged is large, and therefore, there is a risk that the conductive wires 7-5 and 7-6 might contact each other.

Likewise, there is a risk of mutual contacts between the conductive wire 7-8 that connects the outer pad 7-11 and the lead terminal 7-4 connected thereto and between the conductive wire 7-7 that connects the inner pad 7-12 and the lead terminal 7-3 connected thereto.

Figure 8:
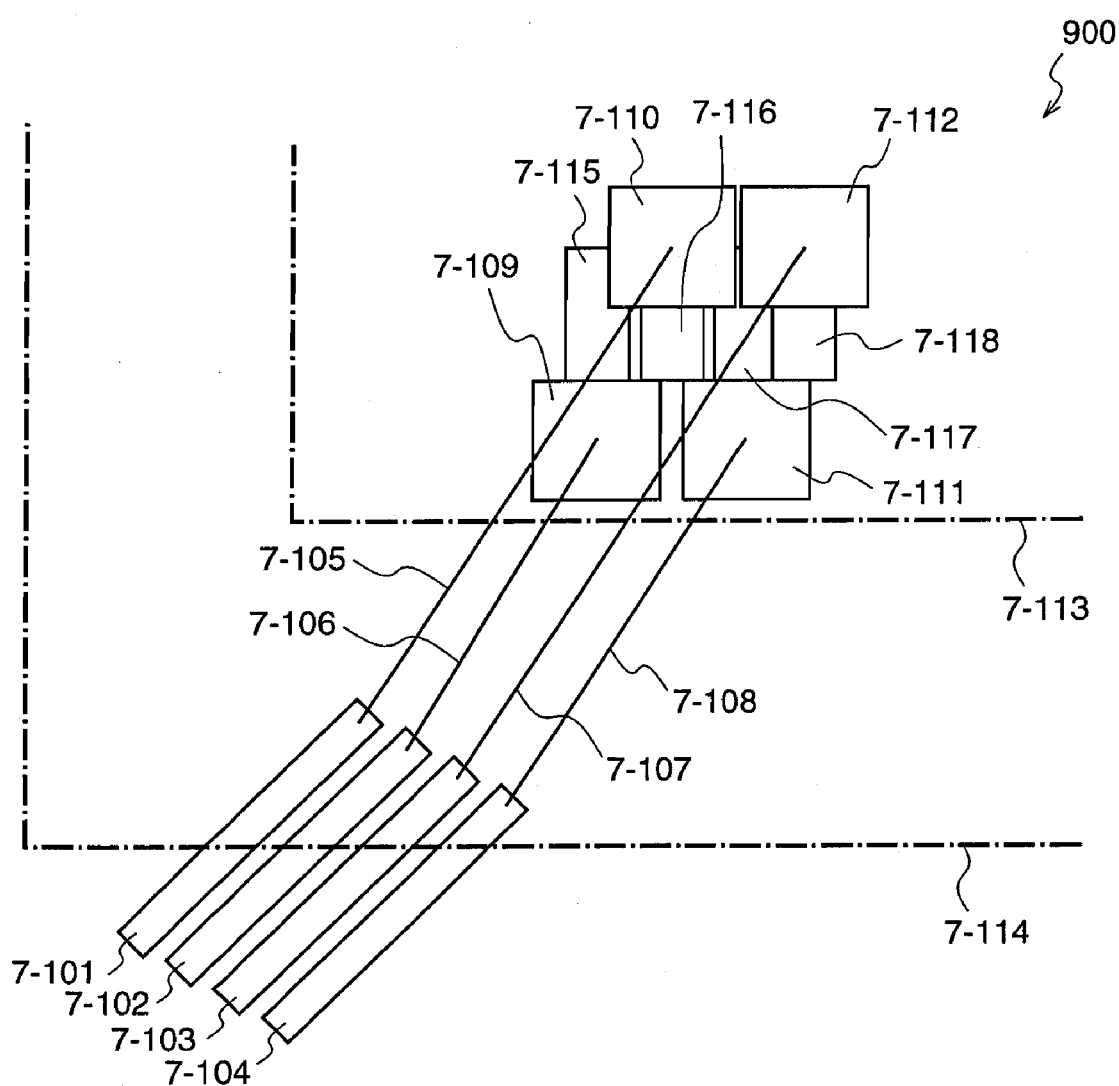
FIG. 8 is a diagram illustrating a layout configuration of IO circuit units in the semiconductor device 900 according to the seventh embodiment of the present invention.
Figure 9:
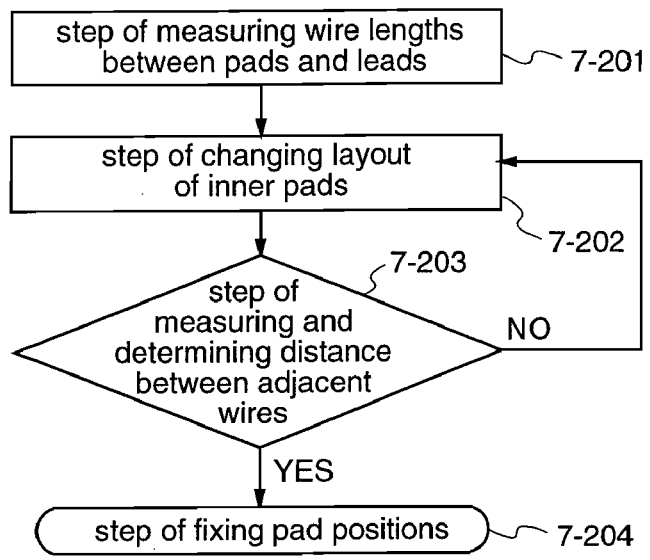
FIG. 9 is a layout configuration change flowchart for IO circuit units in the semiconductor device 900 according to the seventh embodiment of the present invention.

FIG. 8 shows a semiconductor device 800 having a layout configuration of the IO circuit units, which is obtained as a result of performing layout change of the IO circuit units to the layout configuration of the IO circuit units before the layout change according to the seventh embodiment shown in FIG. 7, by using a layout change flow shown in FIG. 9.

With reference to FIG. 8, 7-101 to 7-104 denote lead terminals, 7-105 to 7-108 denotes conductive wires, 7-109 to 7-112 denote pads, 7-113 denotes a semiconductor chip, 7-114 denotes a lead frame, 7-115 to 7-118 denote IO circuit units. The lead terminals 7-101 to 7-104 are disposed on the lead frame 7-114, and connected to package pins. Further, the lead terminals 7-101 to 7-104 are connected to the pads 7-109 to 7-112 on the semiconductor chip 7-113 using the conductive wires 7-105 to 7-108, respectively. Further, the pads 7-109 to 7-112 are disposed on the IO circuit units 7-115 to 7-118, and connected to the IO circuit units, respectively.

Next, a procedure for changing the layout configuration of the IO circuit units according to the seventh embodiment to obtain the semiconductor device 800 shown in FIG. 8 having the IO circuit units 7-115 to 7-118 after the layout change will be described using an IO circuit layout configuration change flow shown in FIG. 9.

In the IO circuit layout configuration change flow shown in FIG. 9, 7-201 denotes a pad-to-lead-terminal wire length measuring step of measuring the lengths of the conductive wires between the pads and the lead terminals, 7-202 denotes an inner PAD layout changing step of changing the layout of the inner pads, 7-203 denotes an adjacent wire distance measuring and determining step of measuring and determining the distance between adjacent wires, and 7-204 denotes a PAD position fixing step of finally fixing the positions of the pads.

In this seventh embodiment, in the layout of the IO circuit units 5-2-9 and 5-2-11 (refer to FIG. 6) in the semiconductor device 600 before the layout configuration change, which is constituted as shown in FIG. 7, initially the lengths of the conductive wires 7-5, 7-6, 7-7, and 7-8, the layout coordinates of the lead terminals 7-1 to 7-4, and the layout coordinates of the pads 7-9 to 7-12 are measured.

In the layout configuration shown in FIG. 7 before the layout configuration change for the IO circuit units according to the seventh embodiment, the conductive wires 7-5 and 7-6 or the conductive wires 7-7 and 7-8 might contact each other, respectively, and this contact state is extracted in the pad-to-lead-terminal wire length measurement step 7-201 shown in FIG. 9, and required moving distances of the bonding pads 7-10 and 7-12 are extracted.

Next, on the basis of the moving distances, in the inner pad layout changing step 7-202 shown in FIG. 9, the pad 7-10 disposed on the inner IO circuit unit 7-16 shown in FIG. 7 and the pad 7-12 disposed on the other IO circuit unit 7-18 are moved toward the inner side of the semiconductor chip.

Figure 10:
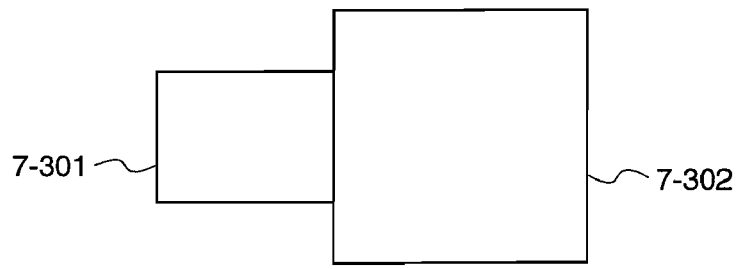
FIG. 10 is a plan view illustrating an IO circuit pad configuration before change in the semiconductor device 900 according to the seventh embodiment of the present invention.
Figure 11:
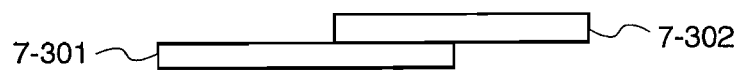
FIG. 11 is a side view illustrating an IO circuit pad configuration before change in the semiconductor device 900 according to the seventh embodiment of the present invention.
Figure 12:
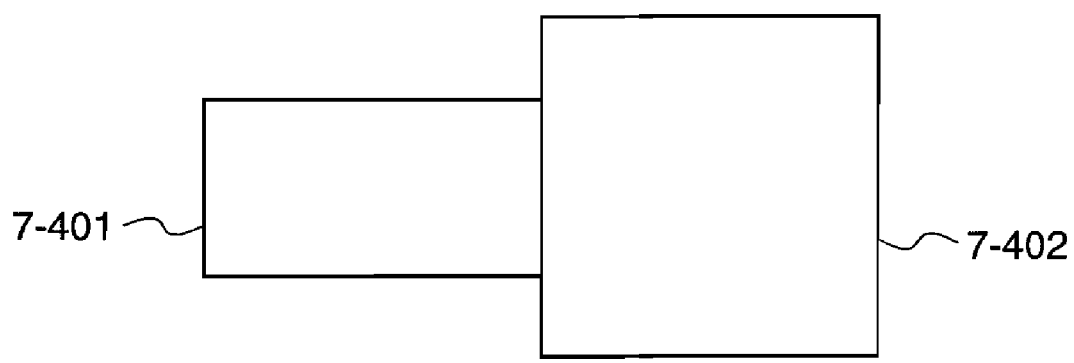
FIG. 12 is a plan view illustrating an IO circuit pad configuration in the semiconductor device 900 according to the seventh embodiment of the present invention.
Figure 13:
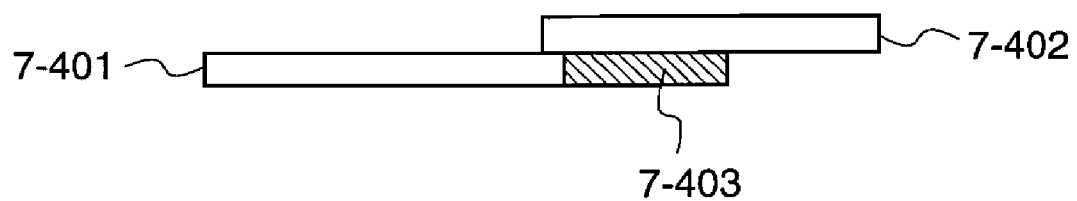
FIG. 13 is a side view illustrating an IO circuit pad configuration in the semiconductor device 900 according to the seventh embodiment of the present invention.

In this seventh embodiment, as shown in FIGS. 10 and 11, a connection part 7-301 of an IO circuit unit and a pad 7-302 are mutually movable.

When the connection part 7-301 of the IO circuit unit and the pad 7-302 are moved, the connection part 7-401 of the IO circuit unit is provided with an extension part 7-403 for extending the IO circuit unit toward the pad side, whereby the pad 7-402 and the connection part 7-401 can be maintained.

The IO circuit unit layout obtained after the pad layout is changed in the inner PAD layout changing step 7-202 shown in FIG. 9 is illustrated in FIG. 8 which has already been described. The respective elements after the layout change are designated by codes obtained by adding 100 to the respective codes in FIG. 7.

Next, in the adjacent conductive wire distance measuring step 7-203, the distance between the conductive wires 7-105 and 7-106 and the distance between the conductive wires 7-107 and 7-108 after the pad layout change are measured, and it is determined whether a wire contact may occur or not between the respective conductive wires.

When wire contact may occur again, the pad layout is again changed in the inner pad layout changing step 7-202.

In the layout configuration of the semiconductor device 900 according to the seventh embodiment shown in FIG. 8, the state where wire contacts can be avoided is shown, and when this state is obtained, an operation of fixing the layout positions of the inner pads and an operation of fixing the wiring of the conductive wires 7-105 to 7-108 are performed in the pad layout fixing step 7-204 shown in FIG. 7.

As described above, the semiconductor device 900 (semiconductor device 3) of the seventh embodiment is constituted such that the inner pads are moved as shown in FIG. 8 in the semiconductor device where the IO circuit units are zigzag arranged as shown in FIG. 7. Therefore, it is possible to provide a semiconductor device which can avoid contacts of lead terminals and pad wires which are likely to occur at the four corners of the semiconductor device.

In this seventh embodiment, the pad and the IO circuit unit are separated from each other, and the respective elements can be moved individually. However, even in a semiconductor device where the relative position of an IO circuit unit and a pad is fixed, the same effects as mentioned above can be achieved by moving the inner IO circuit unit in the zigzag layer simultaneously with the pad.

Embodiment 8

Figure 14:
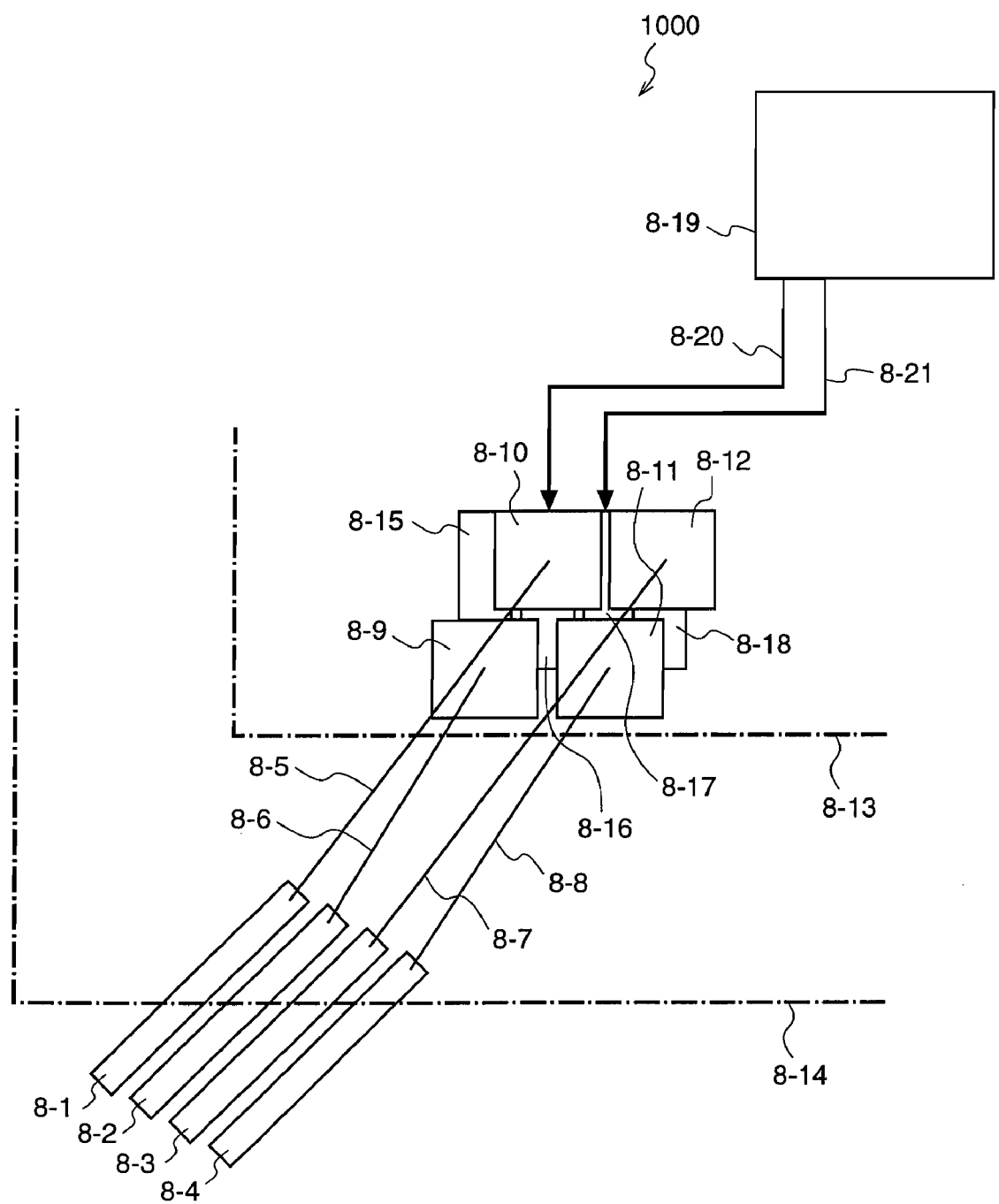
FIG. 14 is a diagram illustrating a layout configuration of IO circuit units before change in a semiconductor device 1000 according to an eighth embodiment of the present invention.

FIG. 14 is a diagram illustrating an example of a layout configuration of IO circuit units before layout change in a semiconductor device 1000 (semiconductor device 4) according to an eighth embodiment. This eighth embodiment is aimed at avoiding contacts of conductive wires between a lead frame and pads at four corners of a chip, and shows only the layout configuration of IO cells at one corner.

In FIG. 14, 8-1 to 8-4 denote lead terminals, 8-5 to 8-8 denotes conductive wires, 8-9 to 8-12 denote pads, 8-13 denotes a semiconductor chip, 8-14 denotes a lead frame, 8-15 to 8-18 denote IO circuit units, 8-19 denotes a signal generation circuit, and 8-20 and 8-21 denote wires between the signal generation circuit and the IO circuit units.

In FIG. 14, the lead terminals 8-1 to 8-4 are disposed on the lead frame 8-14, and connected to package pins. Further, the lead terminals 8-1 to 8-4 are connected to the pads 8-9 to 8-12 on the semiconductor chip 8-13 using the conductive wires 8-5 to 8-9, respectively. Further, the pads 8-9 to 8-12 are disposed on the IO circuit units 8-15 to 8-18, and connected to the respective 10 circuit units. Further, two output signals from the signal generation circuit 8-19 are connected to the IO circuit unit 8-16 that is connected to the pad 8-10 and to the IO circuit unit 8-17 that is connected to the pad 8-11 by the conductive wires 8-20 and 8-21, respectively.

The layout configuration of the IO circuit units before layout change according to the eighth embodiment shown in FIG. 14 adopts the zigzag layout configuration wherein the adjacent pads are arranged alternately at an inner side and an outer side in the semiconductor chip, and two output pins from the signal generation circuit 8-19 are connected to the IO circuit unit 8-16 for the inner pad 8-10 and to the IO circuit unit 8-17 for the outer pad 8-11 via the wires 8-20 and 8-21, respectively.

Figure 17:
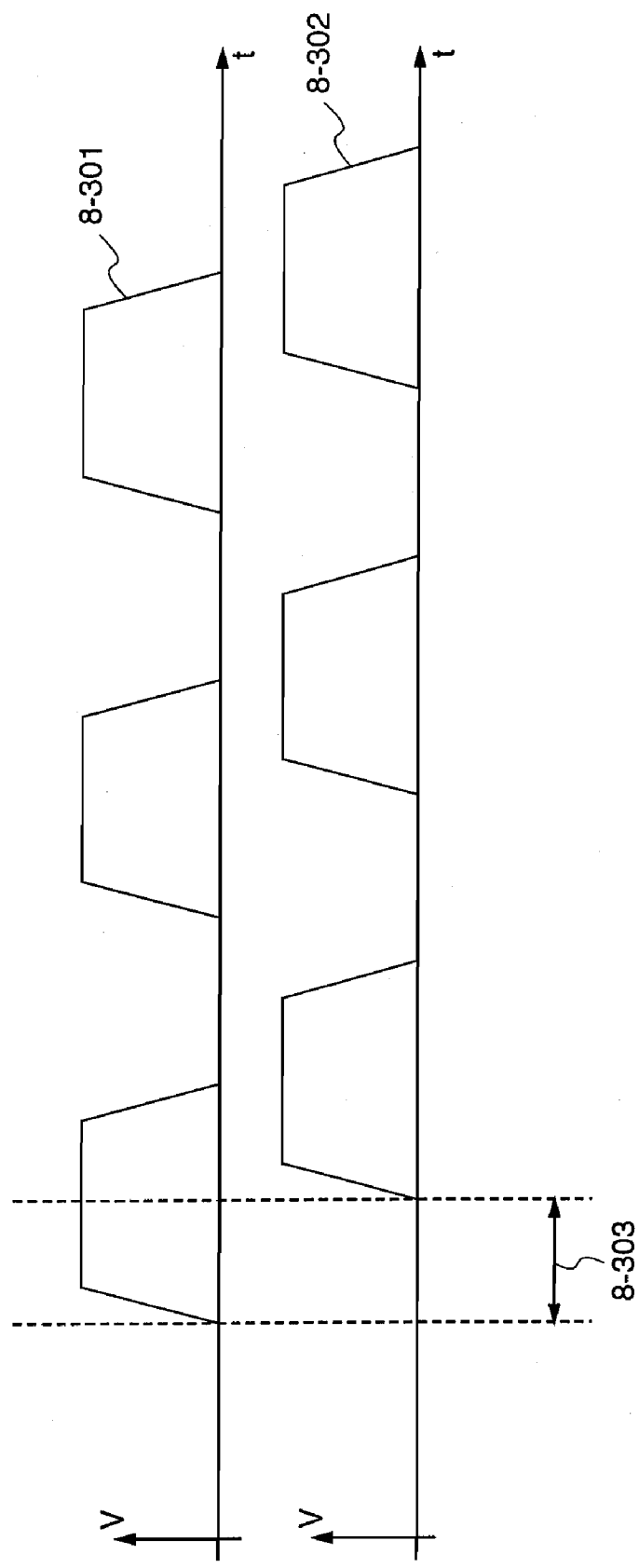
FIG. 17 is an output waveform diagram at a lead terminal of an IO circuit unit before change in the semiconductor device 1000 according to the eighth embodiment.

FIG. 17 shows the timing charts of two output signals from the signal generation circuit 8-19 through the lead terminals 8-1 and 8-4, respectively.

In FIG. 17, 8-301 and 8-302 denote the signal waveforms of the two signals, and a delay difference 8-303 between these signals is caused by a difference in path length between an inner pad and an outer pad.

In a circuit wherein the delay difference between the two signals from the signal generation circuit 8-19 must be reduced as much as possible, such as a differential signal circuit, this delay difference might be an important factor that affects the chip performance.

Figure 16:
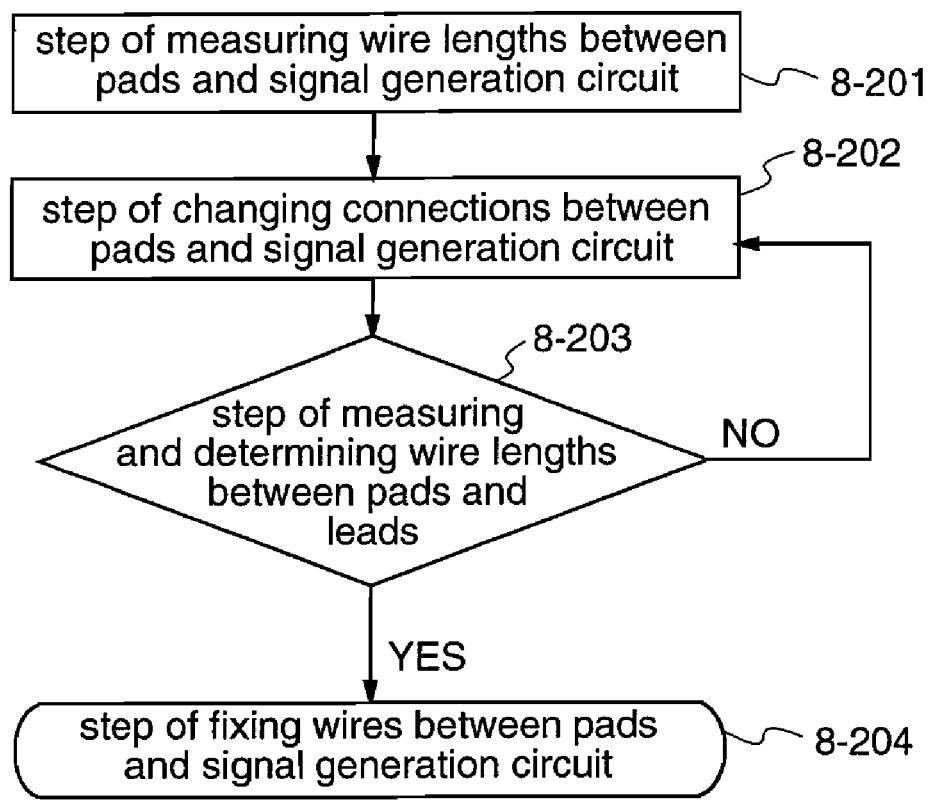
FIG. 16 is a layout configuration change flowchart for IO circuit units in the semiconductor device 1000 according to the eighth embodiment.

So, in this eighth embodiment, a flowchart of a wire modification process for modifying the wires between the signal generation circuit and the IO circuit units is shown in FIG. 16. Hereinafter, the operation of the eighth embodiment will be described with reference to FIG. 16.

First of all, in a pad-to-signal-generation-circuit wire length measurement step 8-201, the lengths of the wires 8-20 and 8-21 to which the two output signals from the signal generation circuit 8-19 are applied are measured.

In a pad-to-signal-generation-circuit connection changing step 8-202, using the information of the measured wire lengths, connections between the signal generation circuit 8-19 and the IO circuit units 8-15 to 8-18 are modified so as to reduce a difference in wire length between the wire 8-20 and the wire 8-21.

For example, when the IO circuit units to which the wire 8-20 and the wire 8-21 are to be connected are the inner IO circuit unit 8-16 and the outer IO circuit unit 8-17, respectively, if a difference in wire length between the wire 8-20 and the wire 8-21 is large, the destination IO circuit unit for the wire 8-21 is changed from the outer IO circuit unit 8-17 to the inner IO circuit unit 8-18.

Next, in a step 8-203, the wire length between the signal generation circuit and the lead after the connection change is measured, and when the difference in wire length is reduced as a result of changing to a wire which reduces the difference in wire length between the signal generation circuit and the lead, the wire between the signal generation circuit and the pad is fixed in a pad-to-signal-generation-circuit wiring fixing step 8-204.

Figure 15:
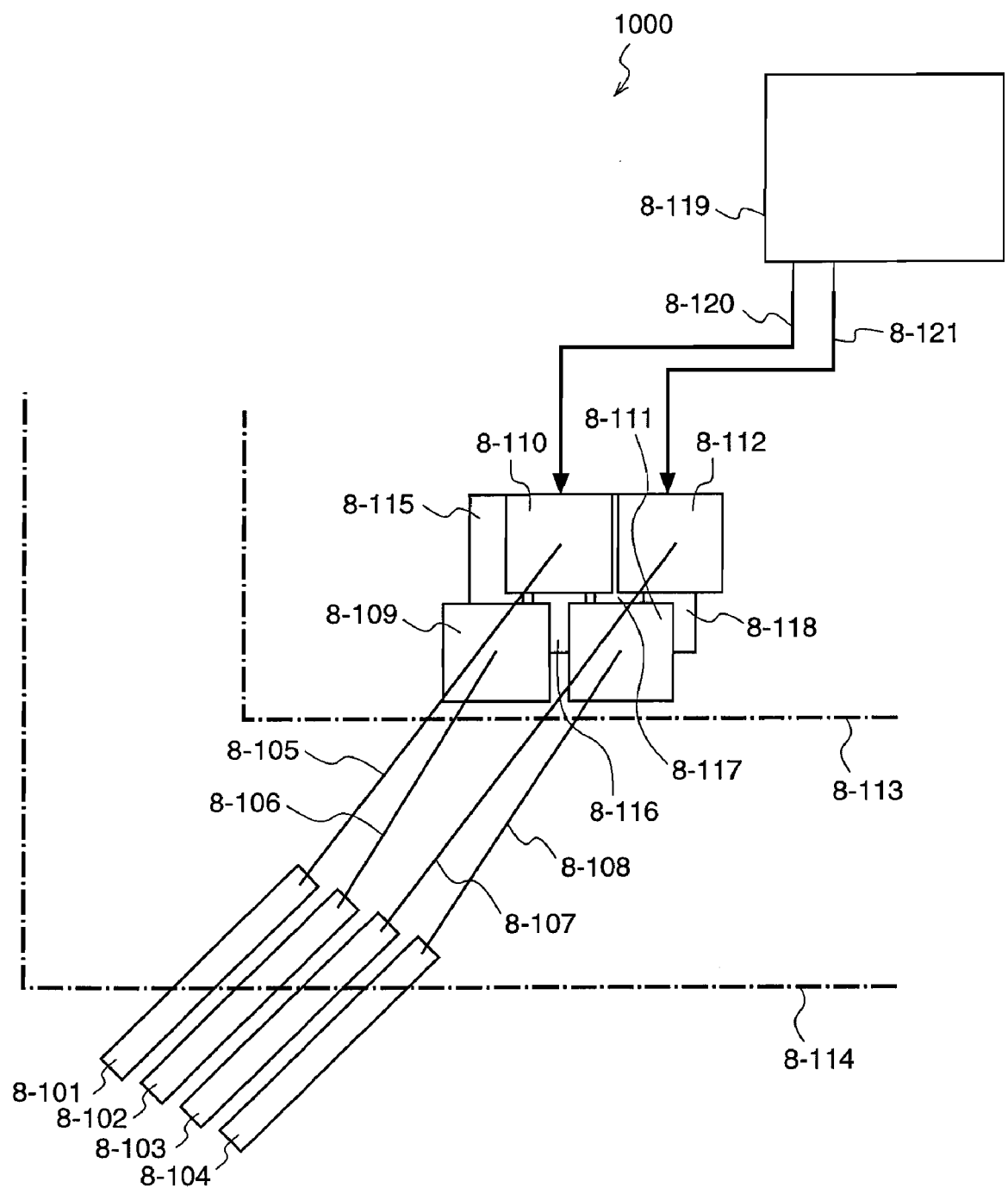
FIG. 15 is a diagram illustrating a layout configuration of IO circuit units in the semiconductor device 1000 according to the eighth embodiment.

FIG. 15 shows the semiconductor device 800 of the eighth embodiment which has been subjected to the wiring change by the above-mentioned method.

In FIG. 15, the paths of the two signal lines from the signal generation circuit 8-119 are changed, and the signal lines are connected to the IO circuit unit 8-116 for the inner pad 8-110 and to the IO circuit unit 8-118 for the inner pad 8-112 so as to reduce a difference thereof.

Figure 18:
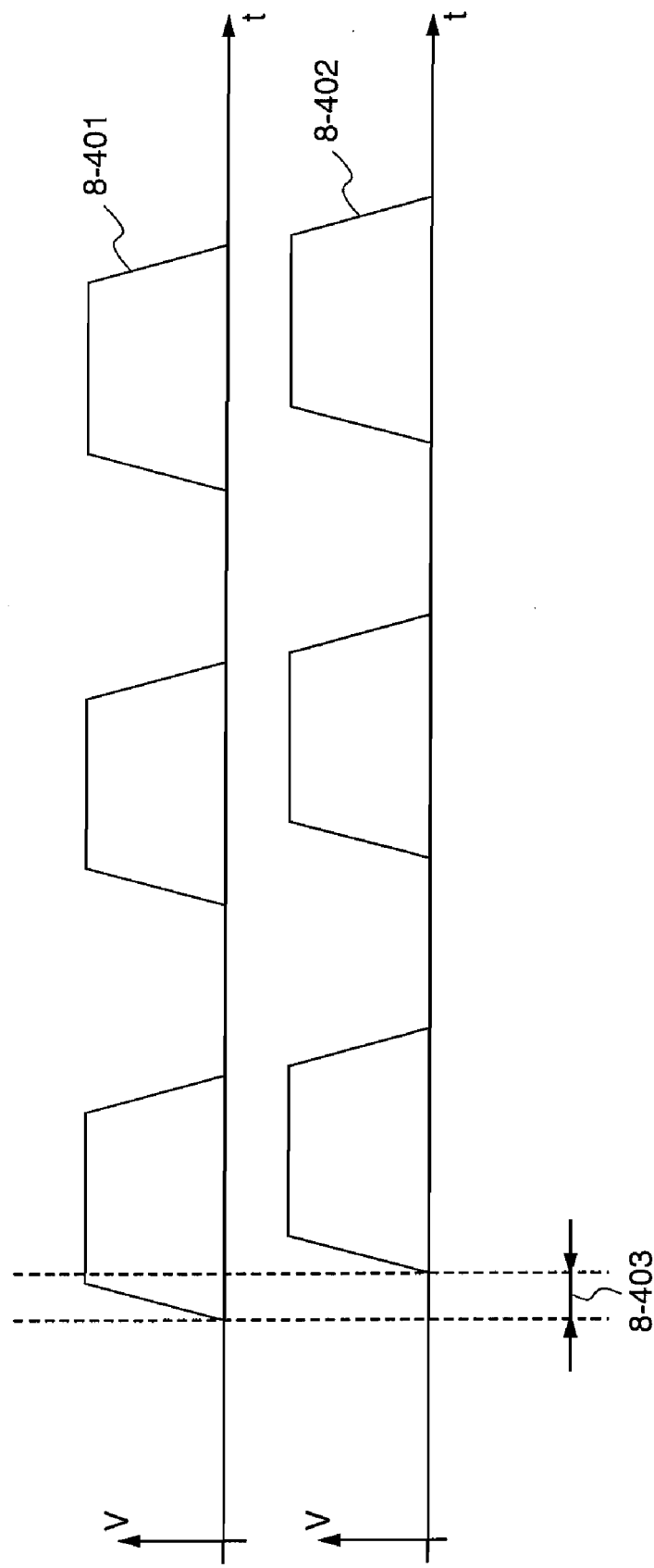
FIG. 18 is an output waveform diagram at a lead terminal of an IO circuit unit in the semiconductor device 1000 according to the eighth embodiment.

FIG. 18 shows timing charts of two output waveforms at the lead terminals in the circuit which has been subjected to the wiring change shown in FIG. 15.

By reducing a difference in wire lengths up to the lead frame 8-114, a delay difference 8-403 between the two output signal waveforms 8-401 and 8-402 can be made smaller than the value in the state before the wiring change according to the eighth embodiment shown in FIG. 17.

According to the eighth embodiment, it is possible to provide a semiconductor device (3-1) which can reduce a delay difference in the output signals.

While in this eighth embodiment description is performed for two output signals, the number of signal lines may be more than 2. Further, while description is performed with respect to the output signals, input signals are also applicable without problems.

Embodiment 9

FIG. 9 shows a layout configuration of a semiconductor device 1100 (semiconductor device 5-1) according to a ninth embodiment of the present invention.

Figure 19:
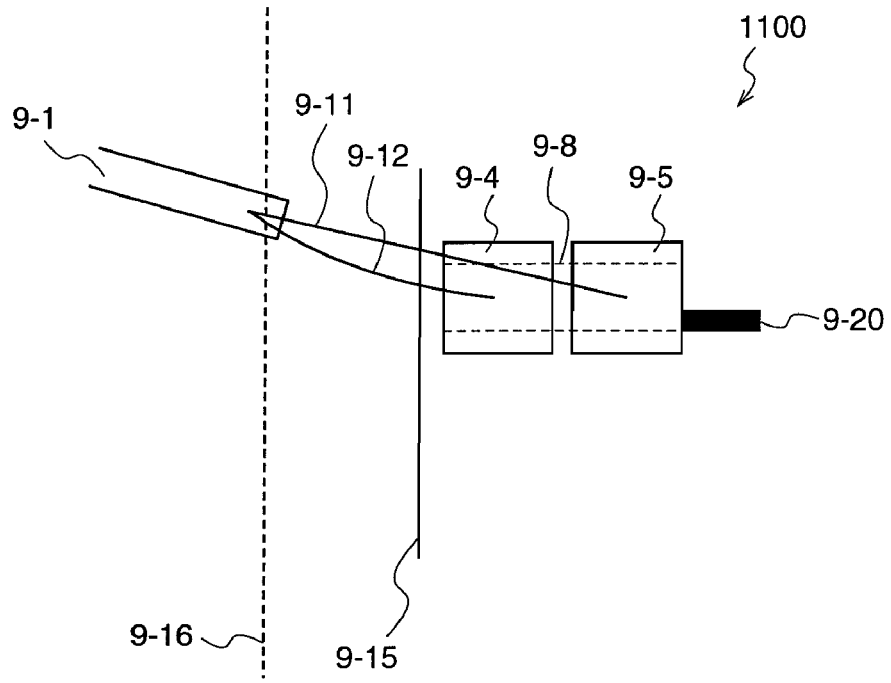
FIG. 19 is a diagram illustrating a layout configuration of IO circuit units in a semiconductor device 1100 according to a ninth embodiment of the present invention.

In FIG. 19, 9-1 denotes a lead terminal, 9-11 denotes a conductive wire, 9-4 and 9-5 denote pads, 9-16 denotes a lead frame, 9-15 denotes a semiconductor chip, and 9-8 denotes an IO circuit unit.

In FIG. 19, the lead terminal 9-1 is connected to a package pin. Further, the lead terminal 9-1 is connected to the pads 9-4 and 9-5 on the semiconductor chip 9-15 using the conductive wires 9-11 and 9-12, respectively. Further, the pads 9-4 and 9-5 are respectively disposed on the IO circuit unit 9-8 and connected to the IO circuit unit. Further, 9-20 denotes a leading part connected to the IO circuit unit 9-8.

The layout configuration of the semiconductor device 1100 of the ninth embodiment shown in FIG. 19 adopts the zigzag layout configuration in which the adjacent pads are alternately arranged at an inner side and an outer side in the chip, and further, the inner pad 9-5 and the outer pad 9-4 are disposed on the corresponding IO circuit unit 9-8, and these pads are connected to the lead terminal 9-1 by the conductive wires 9-11 and 9-12.

As described above, since the semiconductor device 1100 (semiconductor device 5-1) according to the ninth embodiment has the above-described layout configuration, the area of the IO circuit unit can be reduced, and an increase in the allowable current by wires can be achieved, and furthermore, a reduction in the chip size can be realized even when IO limitation is performed.

Embodiment 10

Figure 20:
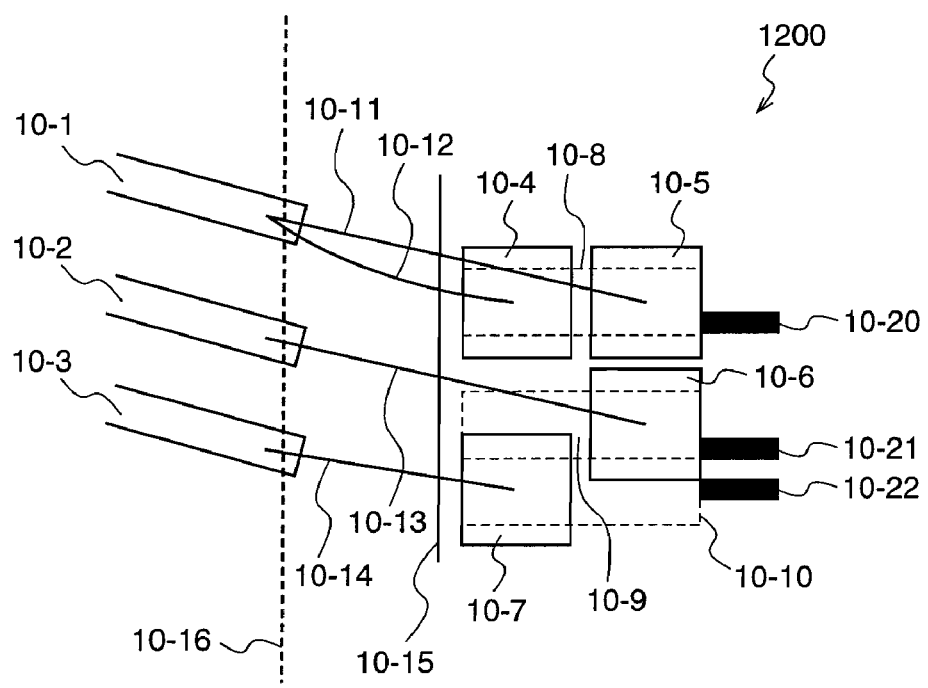
FIG. 20 is a diagram illustrating a layout configuration of IO circuit units in a semiconductor device 1200 according to a tenth embodiment of the present invention.

FIG. 20 is a diagram illustrating a layout configuration of a semiconductor device 1200 (5-2) according to a tenth embodiment of the present invention.

In FIG. 20, 10-1 to 10-3 denote lead terminals, 10-11 to 10-14 denotes conductive wires, 104 to 10-7 denote pads, 10-16 denotes a lead frame, 10-15 denotes a semiconductor chip, 10-8 to 10-10 denote IO circuit units, and 10-20 denotes an inside leading line.

In FIG. 20, the lead terminals 10-1 to 10-3 are connected to package pins. Further, the lead terminals 10-1 to 10-3 are connected to the pads 10-4 to 10-7 on the semiconductor chip 10-15 using the conductive wires 10-11 to 10-14, respectively. Further, the pads 10-4 to 10-7 are disposed on the IO circuit units 10-8 to 10-10, and connected to the IO circuit units, respectively.

In the layout configuration of the semiconductor device 1200 of the tenth embodiment shown in FIG. 20, the zigzag layout configuration in which the adjacent pads are alternately disposed at an inner side and an outer side in the chip is adopted, and the inner pad 10-5 and the outer pad 10-4 are disposed on the desired IO circuit unit 10-8, and the both pads are connected to the lead terminal 10-1 by the conductive wires 10-11 and 10-12, respectively. Further, while the outer pad 10-4 and the inner pad 10-5 are disposed on the same IO circuit unit 10-8, the outer pad 10-4 is used for power supply to an adjacent IO circuit unit (not shown) and is not connected to the internal circuit with a metal layer, while the inner pad 10-5 can be used for power supply to the internal circuit by the leading line 10-20. Further, a leading line 10-21 is also provided at the inner side of the IO circuit unit 10-9, and a leading line 10-22 is also provided at the inner side of the IO circuit unit 10-10.

Since the semiconductor device 1200 (semiconductor device 5-2) according to the tenth embodiment is constructed as described above, it is possible to perform power supply to the respective pads while reducing the common impedance in the pads and the IO circuit units.

Embodiment 11

Figure 21:
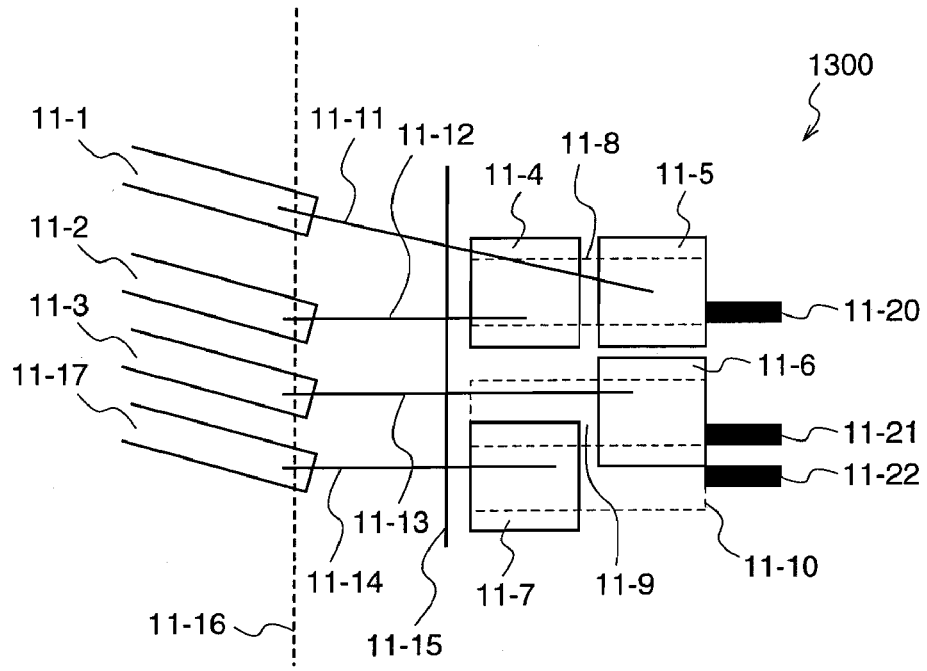
FIG. 21 is a diagram illustrating a layout configuration of IO circuit units in a semiconductor device 1300 according to an eleventh embodiment of the present invention.

FIG. 21 is a diagram illustrating a layout configuration of a semiconductor device 1300 (semiconductor device 5-3) according to an eleventh embodiment of the present invention.

In FIG. 21, 11-1 to 11-3 denote lead terminals, 11-11 to 11-14 denote conductive wires, 11-4 to 11-7 denote pads, 11-16 denotes a lead frame, 11-15 denotes a semiconductor chip, 11-8 to 11-10 denote IO circuit units, and 11-20, 11-21, and 10-22 denote leading lines.

In the construction of the eleventh embodiment, the lead terminals 11-1 to 11-3 are connected to package pins. Further, the lead terminals 11-1 to 11-3 are connected to the pads 11-5, 11-4, and 11-6 on the semiconductor chip 12-15 using the conductive wires 11-11 to 11-13, respectively, and the lead terminal 11-17 is connected to the pad 11-7 on the semiconductor chip 12-15 using the conductive wire 11-14.

Further, the pads 11-4 and 11-5, the pad 11-6, and the pad 11-7 are disposed on the IO circuit units 11-8, 11-9, and 11-10, respectively, and connected to these IO circuit units. The outer pad 11-4 and the inner pad 11-5 guide the potentials to the internal circuit through the leading line 11-20. Further, the inner pad 11-6 guides the potential to the internal circuit through the leading line 11-21, and the outer pad 11-7 guides the potential to the internal circuit through the IO circuit unit 11-10 and the leading line 11-22.

The semiconductor device 1300 of the eleventh embodiment shown in FIG. 21 adopts the zigzag layout configuration in which the adjacent pads are alternately disposed at an inner side and an outer side on the chip. Further, in FIG. 21, the inner pad 11-5 and the outer pad 11-4 are disposed on the corresponding IO circuit unit 11-8, and the both pads are connected to the different lead terminals 11-1 and 12-2 by the conductive wires 11-11 and 11-12, respectively. Further, the outer pad 11-4 and the inner pad 11-5 are disposed on the same IO circuit unit 11-8, and are connected to the same potential by using a metal layer in the IO circuit unit, and are connected to the internal circuit by the leading line 11-20. Further, the potential of the inner pad 11-6 is guided to the internal circuit by the leading line 11-21, and the potential of the outer pad 11-7 is guided to the internal circuit by the IO circuit unit 11-10 and the leading line 11-22.

Since the semiconductor device 1300 (semiconductor device 5-3) according to the eleventh embodiment is constituted as described above, handing-over of the signal lines of the same potential can be performed with the width of one IO cell by using two conductive wires, whereby the allowable current amount can be increased without increasing the number of IO cells, resulting in a reduction in the chip size.

Embodiment 12

Figure 22:
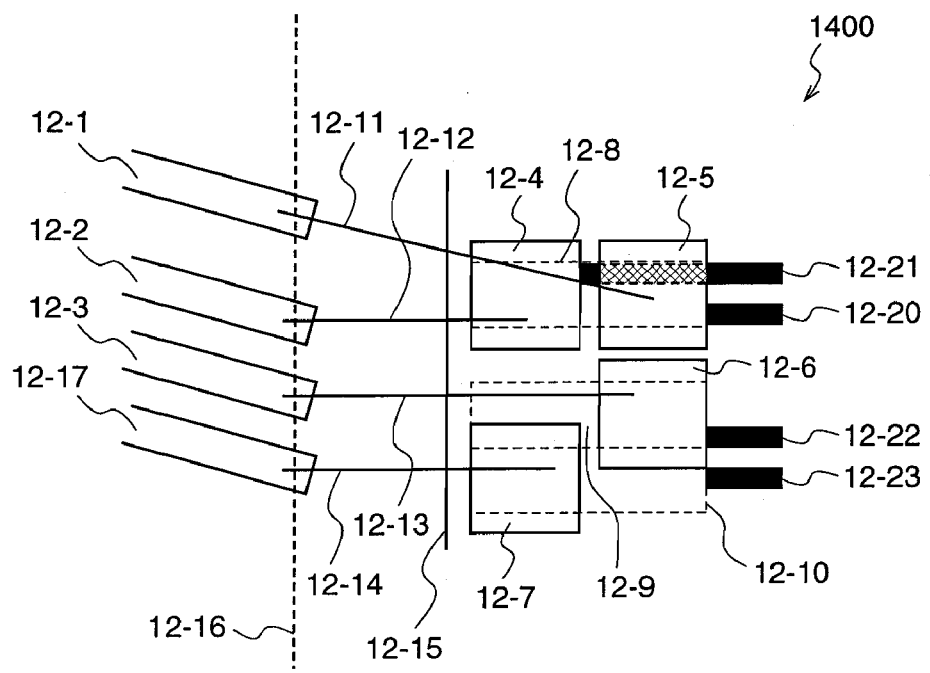
FIG. 22 is a diagram illustrating a layout configuration of IO circuit units in a semiconductor device 1400 (semiconductor device 5-4) according to a twelfth embodiment of the present invention.
Figure 23:
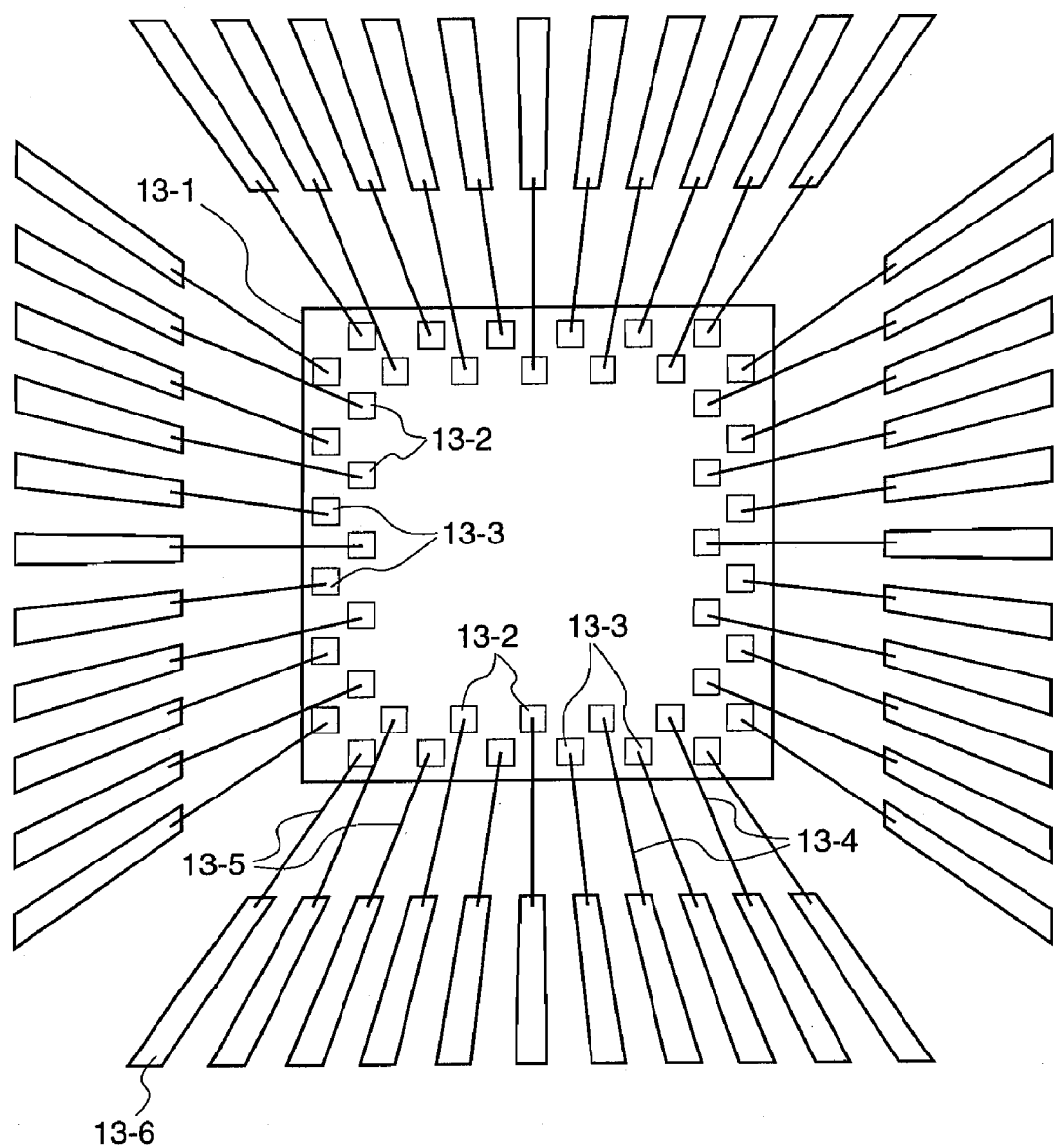
FIG. 23 is a diagram illustrating a zigzag pad layout configuration in the conventional semiconductor device.

FIG. 22 is a diagram illustrating a layout configuration of a semiconductor device 1400 (semiconductor device 504) according to a twelfth embodiment.

In FIG. 22, 12-1 to 12-3, and 12-17 denote lead terminals, 12-11 to 12-14 denote conductive wires, 12-4 to 12-7 denote pads, 12-16 denotes a lead frame, 12-15 denotes a semiconductor chip, 12-8 to 12-10 denote IO circuit units, and 12-20, 12-21, 12-22, and 12-23 denote leading lines to the inside.

The twelfth embodiment shown in FIG. 22 is constituted such that two lead lines to the inside 12-20 and 12-21 are respectively provided for the outer pad 12-4 and the inner pad 12-5 which are disposed on the IO circuit unit 12-8 in contrast to the eleventh embodiment shown in FIG. 21, while other constituents are identical to those of the eleventh embodiment.

In the layout configuration of the semiconductor device 1400 of the twelfth embodiment shown in FIG. 22, the zigzag layout configuration in which the adjacent pads are alternately arranged at the inner side and the outer side on the chip is adopted, and the inner pad 12-5 and the outer pad 12-4 are disposed on the corresponding IO circuit unit 12-8, and the both pads are connected to the lead terminals 12-1 and 12-2 by the conductive wires 12-11 and 12-12, respectively. Further, while the outer pad 12-4 and the inner pad 12-5 are disposed on the same IO circuit unit 12-8, the outer pad 12-4 and the inner pad 12-5 are connected to the internal circuit by the leading line 12-21 and the leading line 12-20, respectively, with the individual potentials through the IO circuit unit.

Since the semiconductor device 1400 (semiconductor device 5-4) according to the twelfth embodiment is constituted as described above, handing-over of the signal lines of different potentials can be performed with the width of one IO cell, whereby the chip size can be reduced.

A semiconductor device according to the present invention is particularly effective for a semiconductor element structure in which pads are arranged in two lines, in avoiding contact of conductive wires during assembly, reducing the cost by chip size reduction, and improving the quality. Further, the present invention is preferably applicable to a thin semiconductor device such as a LQFP.

The invention claimed is:

1. A semiconductor device comprising:
   a semiconductor element having plural pads, the plural pads being connected to plural function terminals in a lead frame of an external package via conductive wires, the plural pads being arranged in two lines along the periphery of the semiconductor element, wherein
   pads in a first line of the two lines of the plural pads which are arranged along the periphery of the semiconductor element are arranged proximate to each other, and pads in a second line of the two lines of the plural pads which are arranged along the periphery of the semiconductor element are arranged proximate to each other,
   the semiconductor element has positions where an arrangement order of the plural pads in one direction along the periphery differs from an arrangement order of the plural function terminals in the lead frame of the external package, and
   IO circuit units are connected to the pads in the first line of the two lines of the plural pads and are connected to the pads in the second line of the two lines of the plural pads, each IO circuit unit of the IO circuit units connected to one pad of the pads in the first line of the two lines of the plural pads or one pad of the pads in the second line of the two lines of the plural pads, and
   the semiconductor element has positions where an arrangement order of the IO circuit units in one direction along the periphery differs from an arrangement order of the plural function terminals in the lead frame of the external package.

2. A semiconductor device as defined in claim 1 wherein two conductive wires are connected to one function terminal of the plural function terminals in the lead frame and a first conductive wire of the two conductive wires is connected to a first pad on the semiconductor element, and a second conductive wire of the two conductive wires is connected to a second pad, the first and second conductive wires being connected to the first and second pads at the positions where the arrangement order of the plural function terminals in the lead frame on the external package side differs from the arrangement order of the plural pads arranged in two lines along the periphery of the semiconductor element, in one direction along the periphery.

3. A semiconductor device as defined in claim 2 wherein the one function terminal in the lead frame, to which the two conductive wires are connected, is a function terminal which supplies power supply voltage or GND.

4. A semiconductor device as defined in claim 3 wherein the first and second pads on the semiconductor element which are connected to the one function terminal on the lead frame via the first and second conductive wires are power supply pads or GND pads, and
   each IO circuit unit of the IO circuit units operates for signal input or output and is disposed sandwiched between the first and second power supply pads or GND pads on the semiconductor element.

5. A semiconductor device as defined in claim 1 wherein the conductive wires are connected so as not to intersect with each other when the semiconductor element is viewed from above.

6. A semiconductor device as defined in claim 1 wherein at least one of said positions is adjacent a corner of said semiconductor element.

* * * * *